(12) United States Patent
Ohashi et al.

(10) Patent No.: US 7,667,224 B2
(45) Date of Patent: Feb. 23, 2010

(54) SEMICONDUCTOR LIGHT EMITTING DEVICE AND SEMICONDUCTOR LIGHT EMITTING APPARATUS

(75) Inventors: Kenichi Ohashi, Kanagawa (JP); Yasuharu Sugawara, Kanagawa (JP); Shuji Itonaga, Kanagawa (JP); Yasuhiko Akaike, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 11/680,918

(22) Filed: Mar. 1, 2007

(65) Prior Publication Data

US 2007/0145883 A1 Jun. 28, 2007

Related U.S. Application Data

(62) Division of application No. 11/143,993, filed on Jun. 3, 2005, now abandoned.

(30) Foreign Application Priority Data

Mar. 9, 2005 (JP) .............................. 2005-065589

(51) Int. Cl.
*H01L 33/00* (2006.01)
(52) U.S. Cl. .............................. 257/13; 257/95; 257/98; 257/E33.006; 257/E33.063; 257/E33.066; 257/E33.068
(58) Field of Classification Search .................. 257/13, 257/98, 95; 313/112–113
See application file for complete search history.

(56) References Cited

U.S. PATENT DOCUMENTS

| 7,201,494 | B2 * | 4/2007 | You et al. ................... 362/231 |
| 2003/0197191 | A1 | 10/2003 | Nitta et al. |
| 2003/0218172 | A1 * | 11/2003 | Sugawara et al. ............. 257/72 |
| 2005/0230699 | A1 | 10/2005 | Wu et al. |
| 2005/0285128 | A1 * | 12/2005 | Scherer et al. ................. 257/98 |

FOREIGN PATENT DOCUMENTS

| JP | 57-148383 | | 9/1982 |
| JP | 10-200162 | | 7/1998 |
| JP | 2001-36129 | * | 2/2001 |
| JP | 2003-209283 | | 7/2003 |
| JP | 2003-298107 | | 10/2003 |

* cited by examiner

*Primary Examiner*—Ahmed Sefer
(74) *Attorney, Agent, or Firm*—Oblon, Spivak, McClelland, Maier & Neustadt, L.L.P.

(57) ABSTRACT

A semiconductor light emitting device comprises: a substrate; a semiconductor stacked structure; a first electrode; a second electrode; and a reflective film. The substrate has a top face and a rear face electrode forming portion opposed thereto, and is translucent to light in a first wavelength band. The rear face electrode forming portion is surrounded by a rough surface. The semiconductor stacked structure is provided on the top face of the substrate and includes an active layer that emits light in the first wavelength band. The first electrode is provided on the semiconductor stacked structure, and the second electrode is provided on the rear face electrode forming portion. The reflective film is coated on at least a portion of the rough surface.

9 Claims, 34 Drawing Sheets

SEMICONDUCTOR LIGHT EMITTING DEVICE AND SEMICONDUCTOR LIGHT EMITTING APPARATUS

CROSS-REFERENCE TO RELATED APPLICATIONS

This application is a divisional of U.S. application Ser. No. 11/143,993 filed Jun. 3, 2005, and is based upon and claims the benefit of priority from the prior Japanese Patent Application No. 2005-065589, filed on Mar. 9, 2005; the entire contents of each of which are incorporated herein by reference.

BACKGROUND OF THE INVENTION

This invention relates to a semiconductor light emitting device and a semiconductor light emitting apparatus, and more particularly to a semiconductor light emitting device and a semiconductor light emitting apparatus having improved extraction efficiency for light emitted from the active layer.

Semiconductor light emitting devices such as LEDs (light emitting diodes) and LDs (laser diodes) provide various emission wavelengths, high emission efficiency, and long lifetime while being compact in size. For this reason, they are widely used for display, lighting, communication, sensor, and other devices.

In such a semiconductor light emitting device, a semiconductor multilayer film including an n-type cladding layer, active layer, p-type cladding layer, and the like is formed on a substrate of GaAs or sapphire by direct epitaxial growth, or by lamination with a heterogeneous substrate. Electrodes are further formed on the n-type and p-type layers, respectively (e.g., Japanese Laid-Open Patent Applications 2002-353502 and 2001-217467).

However, this type of semiconductor light emitting device does not have sufficiently high extraction efficiency for light emitted from the active layer.

More specifically, the light emitted downward from the active layer is incident on the electrode provided under the substrate. However, the substrate has an alloyed region formed with the electrode material near the interface with the electrode. This causes a problem that the light emitted from the active layer is prone to absorption, which leads to a certain loss inside the chip.

In addition, the light reflected from the lower electrode is attenuated by optical absorption in passing through the active layer. This causes a problem that the reflected light cannot be fully exploited.

There is another problem that total reflection is likely to occur at the side face and the like of the chip. More specifically, the above-described LED is typically processed into a rectangular parallelepiped shape having six smooth faces by cleavage and dicing, and covered with mold resin or the like. However, due to the large difference between a high refractive index of the semiconductor crystal (about 3.5) and a low refractive index of the mold resin (about 1.5), total reflection is likely to occur at the interface therebetween. This decreases the probability that the light emitted inside the chip is extracted outside the chip.

An approach to improving the decrease of light extraction efficiency is to roughen the surface by wet etching or the like to form asperities (e.g., Japanese Laid-Open Patent Application 2001-217467). However, surface roughening is not effective for extracting light emitted toward the bottom face inside the chip mounted on a packaging member.

SUMMARY OF THE INVENTION

According to an aspect of the invention, there is provided a semiconductor light emitting device comprising:
a substrate having a top face and a rear face electrode forming portion opposed thereto, the substrate being translucent to light in a first wavelength band, the rear face electrode forming portion being surrounded by a rough surface;
a semiconductor stacked structure provided on the top face of the substrate and including an active layer that emits light in the first wavelength band;
a first electrode provided on the semiconductor stacked structure;
a second electrode provided on the rear face electrode forming portion; and
a reflective film coated on at least a portion of the rough surface.

According to other aspect of the invention, there is provided a semiconductor light emitting device comprising:
a substrate being translucent to light in a first wavelength band; and
a semiconductor stacked structure provided on a major surface of the substrate and including an active layer that emits light in the first wavelength band,
the substrate having a recess on a mounting surface opposed to the major surface.

According to other aspect of the invention, there is provided a semiconductor light emitting device comprising:
a substrate having first and second major surfaces and being translucent to light in a first wavelength band;
a semiconductor stacked structure provided on the first major surface of the substrate and including an active layer that emits light in the first wavelength band, at least a portion of the semiconductor stacked structure having a first rough surface formed thereon;
a dielectric film provided on the first rough surface;
a bonding pad provided on the dielectric film;
a thin line electrode portion provided on the semiconductor stacked structure and electrically connected to the semiconductor stacked structure and the bonding pad; and
an electrode provided on the second major surface of the substrate.

According to other aspect of the invention, there is provided a semiconductor light emitting apparatus comprising:
a packaging member;
a semiconductor light emitting device mounted on the packaging member; and
a wire connected to the semiconductor light emitting device,
the semiconductor light emitting device including:
a semiconductor stacked structure including an active layer that emits light; and
a bonding pad provided on the semiconductor stacked structure and connected to a fusion bonding portion for the wire, the bonding pad having a smaller pattern than the fusion bonding portion.

DETAILED DESCRIPTION OF THE INVENTION

Embodiments of the invention will now be described with reference to the drawings.

First Embodiment

Figure 1:
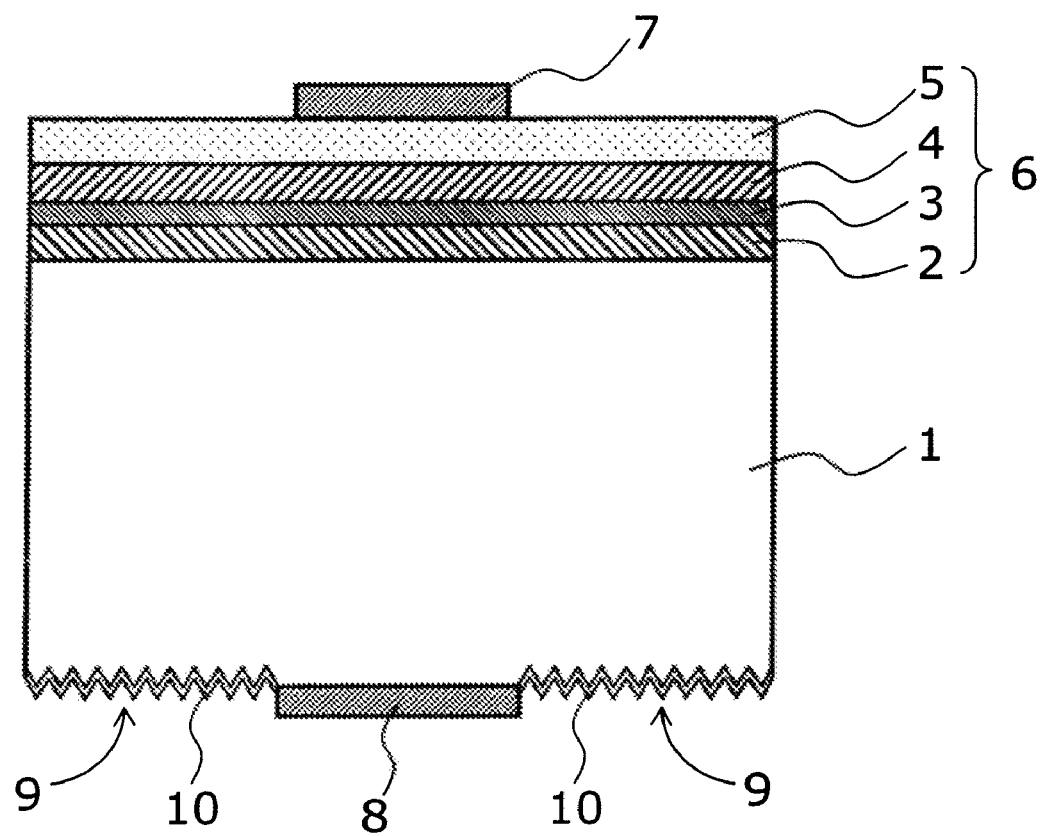
FIG. 1 is a schematic view illustrating the cross-sectional structure of a semiconductor light emitting device according to a first embodiment of the invention.

FIG. 1 is a schematic view illustrating the cross-sectional structure of a semiconductor light emitting device according to a first embodiment of the invention.

More specifically, the semiconductor light emitting device of this example has a structure comprising a substrate 1 on which a cladding layer 2, active layer 3, cladding layer 4, and current diffusion layer 5 are stacked in this order. An electrode 7 is provided on the current diffusion layer 5 via a contact layer (not shown). On the other hand, an electrode 8 is formed on part of the rear side of the substrate 1. The remaining portion is formed into a rough surface 9 with asperities, the surface of which is coated with a reflective film 10.

The substrate 1 is translucent to light emitted from the active layer 3. For example, the substrate 1 is made of p-type GaP. The cladding layer 2 can be formed from p-type InAlP, the active layer 3 from InGaAlP, the cladding layer 4 from n-type InAlP, and the current diffusion layer 5 from n-type InGaAlP. In this case, the contact layer provided between the current diffusion layer 5 and the electrode 7 may be made of n-type GaAs.

Epitaxial growth of an InGaAlP-based compound semiconductor layer directly on the GaP substrate 1 is difficult. For this reason, a stacked structure 6 of InGaAlP-based compound semiconductor is first epitaxially grown on a GaAs substrate. The p-type GaP substrate 1 is laminated thereon by wafer bonding technology. The GaAs substrate can then be removed by etching or the like to form the stacked structure of the present example.

The reflective film 10 may be made of, for example, metal such as gold (Au), or dielectric. In this respect, for example, silicon oxide or silicon nitride may be used to form the so-called "HR (High Reflectance) coating" in which the relationship between the refractive index and the thickness yields a maximal reflectance. Alternatively, the reflective film 10 may be made of a DBR (Distributed Bragg Reflector) in which two kinds of semiconductor layers having different refractive indices are alternately stacked.

In this embodiment, the extraction efficiency for light emitted downward from the active layer 3 can be improved by providing the rough surface 9 and the reflective film 10 on the rear face of the substrate 1.

Figure 2:
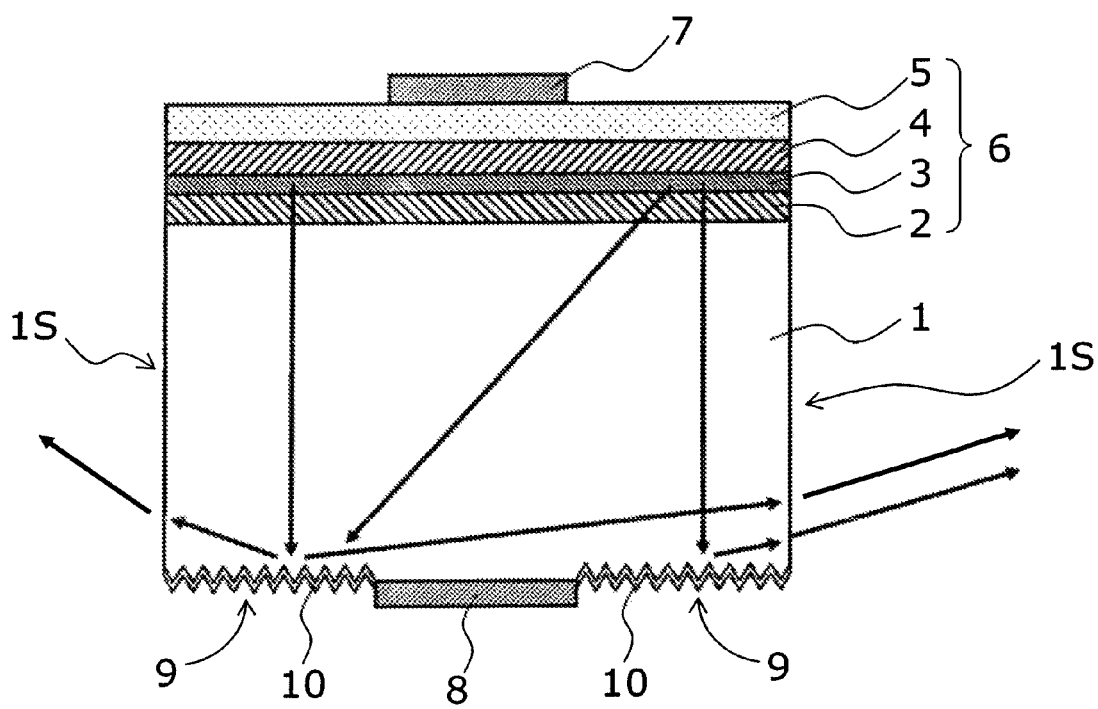
FIG. 2 is a schematic view illustrating extraction paths of light emitted from the active layer 3.

FIG. 2 is a schematic view illustrating extraction paths of light emitted from the active layer 3.

The light emitted from the active layer 3 is scattered toward the side face 1S of the substrate 1 by the rough surface 9 and the reflective film 10 as shown by arrows in this figure. Since the scattered light is incident on the side face 1S of the substrate 1 at a relatively small angle (i.e., at a nearly perpendicular angle with respect to the side face 1S), it is emitted outside at the side face 1S without total reflection. As described above, this type of semiconductor light emitting device is typically sealed with translucent resin having a refractive index of about 1.5. Therefore the light emitted from inside the chip is susceptible to total reflection at the interface between the semiconductor layer and the resin. On the contrary, in the present embodiment, the light can be scattered by the rough surface 9 and the reflective film 10 and made incident on the side face 1S of the substrate 1 at a small angle. Therefore the light can be extracted outside without total reflection.

If a flat reflective film is provided without the rough surface 9 on the rear face of the substrate 1, the light emitted downward from the active layer 3 is reflected upward by this reflective film. In this case, however, the reflected light passes through the active layer 3, leading to a certain loss due to reabsorption. On the contrary, in the present embodiment, the rough surface 9 serves to scatter the light toward the side face 1S, reducing the loss due to absorption.

Furthermore, if the electrode 8 is formed entirely on the rear face of the substrate 1, an alloyed region is formed at the interface between the substrate 1 and the electrode 8, and absorbs the light emitted from the active layer 3, leading to a certain loss. In contrast, according to the present embodiment, no alloyed region is present on the rough surface 9, which reflects the light in conjunction with the reflective film 10 with high efficiency. As a result, the loss due to absorption is reduced.

Next, the present embodiment will be described with reference to a method of manufacturing an InGaAlP-based light emitting device by way of example.

FIGS. 3A to 3C and 4A to 4C are process cross-sectional views showing part of a process of manufacturing a semiconductor light emitting device according to this embodiment.

Figure 3A:
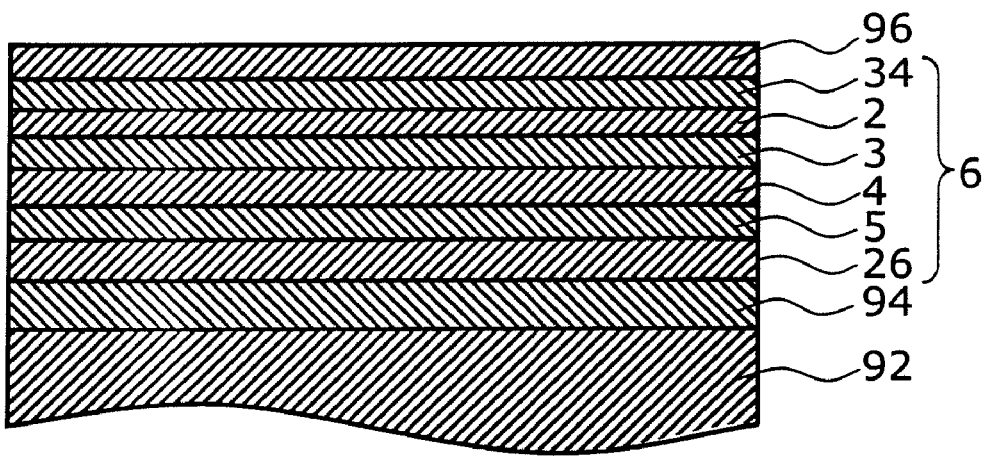
FIGS. 3A to 3C and 4A to 4C are process cross-sectional views showing part of a process of manufacturing a semiconductor light emitting device according to the embodiment of the invention.

First, as shown in FIG. 3A, an InAlP etch stop layer 94, GaAs contact layer 26, InGaAlP current diffusion layer 5, n-type InAlP cladding layer 4, InGaAlP active layer 3, p-type InAlP cladding layer 2, InGaP bonding layer 34, and InAlP cover layer 96 are grown on an n-type GaAs substrate 92. The n-type GaAs substrate 92 may be a mirror-finished substrate having a diameter of 3 inches and a thickness of 350 μm, and doped with silicon (Si) at a carrier concentration of about $1 \times 10^{18}/cm^3$.

The etch stop layer 94 may have a thickness of 0.2 μm. The GaAs contact layer 26 has a thickness of 0.02 μm and a carrier concentration of $1 \times 10^{18}/cm^3$. The InGaAlP current diffusion layer 5 is made of InGaAlP and may have a thickness of 1.5 μm. The n-type cladding layer 4 is made of InAlP and may have a thickness of 0.6 μm. The active layer 3 is made of InGaAlP and may have a thickness of 0.4 μm. The p-type cladding layer 2 is made of InAlP and may have a thickness of 0.6 μm. The InGaP bonding layer 34 may have a thickness of 0.1 μm, and the InAlP cover layer 96 may have a thickness of 0.15 μm.

Next, this epitaxial wafer is washed with surfactant, immersed in a mixture of ammonia and hydrogen peroxide solution with a volume ratio of 1:15 to etch the rear side of the GaAs substrate 92, thereby removing any reaction products and the like produced in the epitaxial growth and attached to the rear face of the epitaxial wafer.

Next, the epitaxial wafer is washed again with surfactant. The topmost InAlP cover layer 96 is then removed with phosphoric acid to expose the InGaP bonding layer 34.

Figure 3B:
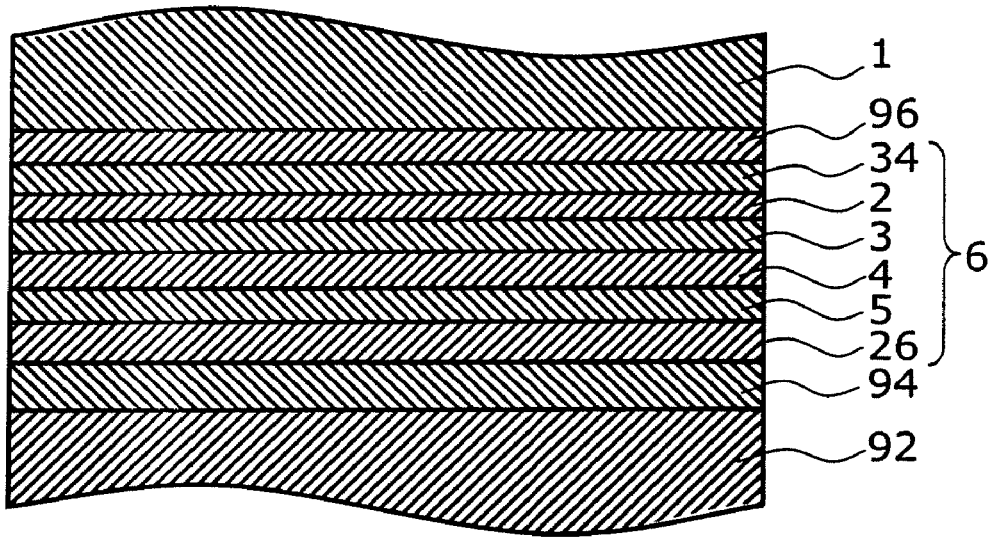

Subsequently, as shown in FIG. 3B, a GaP substrate 1 is laminated. In the following, a process of direct lamination will be described.

The GaP substrate 1 may be, for example, a mirror-finished, (100)-oriented p-type substrate having a diameter of 3 inches and a thickness of 300 μm. A high concentration layer may be formed on the surface of the GaP substrate 1 to lower the electric resistance at the bonding interface. As a preprocess for direct bonding, the GaP substrate 1 is washed with surfactant, immersed in dilute hydrofluoric acid to remove natural oxidation film on the surface, washed with water, and then dried using a spinner. With regard to the epitaxial wafer, after the cover layer 96 on the surface thereof is removed, it is treated with dilute hydrofluoric acid, washed with water, and spin-dried, in the same way as for the GaP substrate 1. Preferably, these preprocesses are entirely performed under a clean atmosphere in a clean room.

Next, the preprocessed epitaxial wafer is placed with the InGaP bonding layer 34 turned up, on which the GaP substrate 1 is mounted with its mirror surface turned down, and closely contacted at room temperature.

Next, as a final step of direct bonding, the wafers contacted at room temperature are set up in a line on a quartz boat, and placed in a diffusion oven for heat treatment. The heat treatment may be performed at a temperature of 800° C. for a duration of one hour in an atmosphere of argon containing 10% hydrogen. This heat treatment integrates the GaP substrate 1 with the InGaP bonding layer 34, thereby completing the bonding.

Figure 3C:
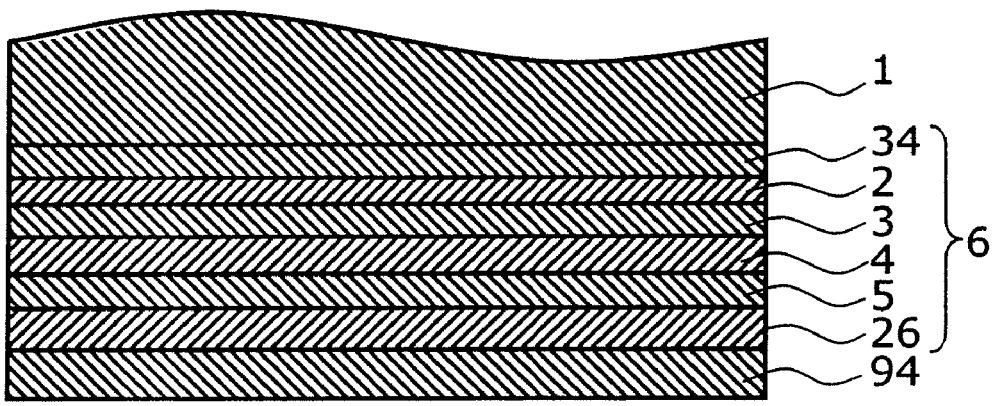

Next, as shown in FIG. 3C, the GaAs substrate 92 of the epitaxial wafer is removed. More specifically, the bonded wafer is immersed in a mixture of ammonia and hydrogen peroxide solution to selectively etch the GaAs substrate 92. This etching step stops at the InAlP etch stop layer 94. Next, etching is performed with phosphoric acid at 70° C. to selectively remove the InAlP etch stop layer 94.

The foregoing process results in a bonded substrate for LED in which the GaP transparent substrate 1 is bonded to the stacked structure 6 of InGaAlP-based semiconductor.

Figure 4A:
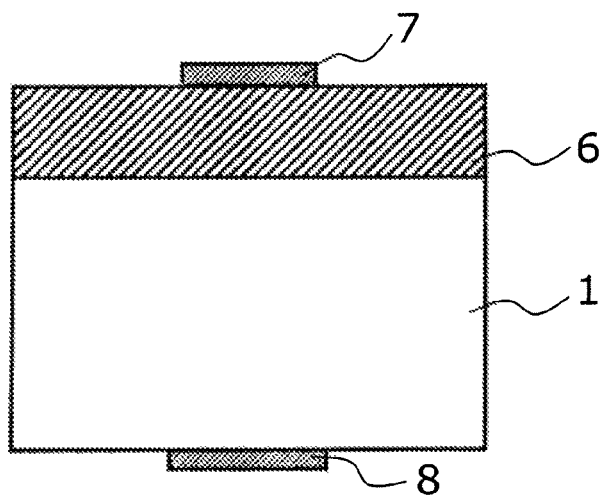

Next, as shown in FIG. 4A, an n-side electrode 7 is formed on the GaAs contact layer 26, and a p-side electrode 8 is formed on the rear face of the GaP substrate 1.

The contact layer 26 surrounding the n-side electrode 7 is etched away in order to avoid absorption by the GaAs contact layer 26.

The n-side electrode 7 may be a stacked structure of, for example, AuGe (250 nm)/Mo (150 nm)/AuGe (250 nm)/Au (300 nm) from the contact layer 26 side. The p-side electrode 8 may be made of, for example, metal containing gold (Au) with 5% zinc (Zn). In addition, a eutectic solder layer such as AuSn (1000 nm) may be provided via Au (100 nm) on the surface of the p-side electrode 8.

Figure 4B:
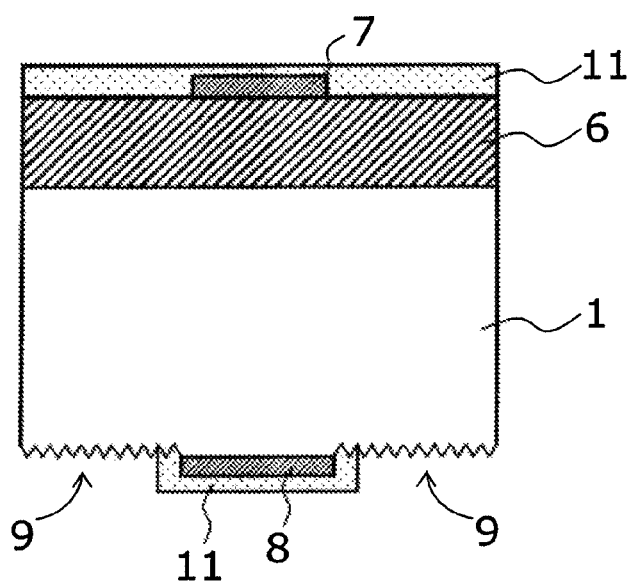

Next, as shown in FIG. 4B, a rough surface 9 is formed on the rear face of the substrate 1.

First, protection films 11 are formed on the n-side electrode 7 and the p-side electrode 8, respectively. The protection film 11 may be made of material such as resist, silicon oxide, or silicon nitride, for example.

Subsequently, a rough surface 9 is formed by etching the rear face of the GaP substrate 1 exposed around the periphery of the p-side electrode 8. The etching condition may be, for example, immersion in concentrated hydrofluoric acid for about 10 minutes.

Figure 5:
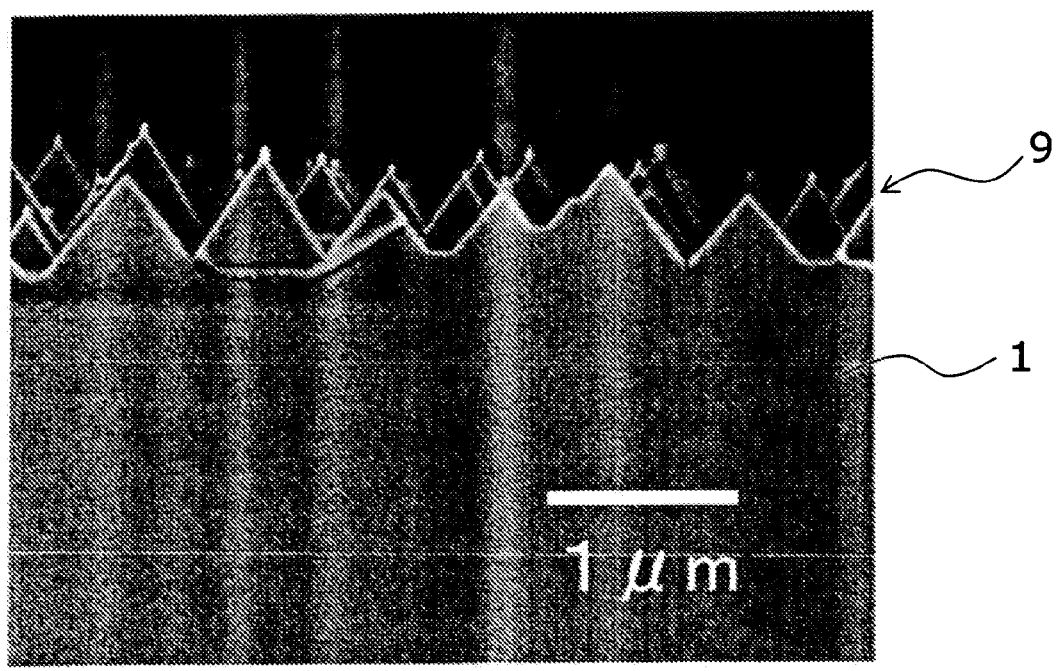
FIG. 5 is a micrograph showing the rough surface 9 formed on the rear face of the GaP substrate 1.

FIG. 5 is an electron micrograph showing the rough surface 9 formed on the rear face of the GaP substrate 1 according to this process. As a result of hydrofluoric acid etching, the rear face of the substrate 1 is covered with pyramids having a width and height of generally 1 micrometer. The rough surface 9 composed of a collection of such pyramids provides a high scattering effect on the light emitted downward from the active layer 3.

Figure 4C:
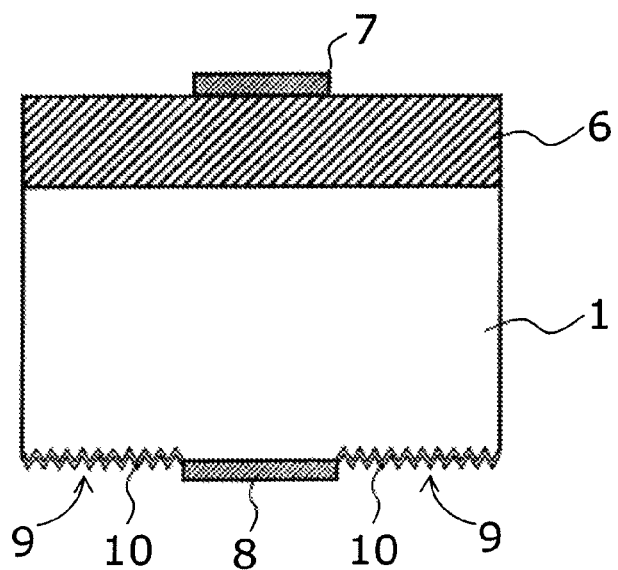

Subsequently, as shown in FIG. 4C, the rough surface 9 is coated with a reflective film 10.

More specifically, for example, the reflective film 10 can be formed by depositing gold (Au) using vacuum deposition. Subsequently, the protection films 11 provided on both sides of the wafer are removed. Chips are separated by dicing or otherwise to result in a semiconductor light emitting device of the present embodiment.

When metal is used for the material of the reflective film 10, alloying with the substrate 1 decreases the reflectance and leads to a certain loss. For this reason, when heat treatment (sinter) is needed to lower the contact resistance of the n-side electrode 7 and the p-side electrode 8, the reflective film 10 is formed preferably after this heat treatment.

Alternatively, ohmic metal can be used for the material of the reflective film 10. More specifically, when light absorption due to alloying with the substrate 1 is not substantial, ohmic metal may be used for the material of the reflective film 10.

As described above, in this embodiment, the rear face of the GaP substrate 1 is etched by hydrofluoric acid to form a rough surface 9 that provides a high scattering effect, which allows improvement of light extraction efficiency.

FIGS. 6 to 9 are schematic views illustrating the configuration of the rear face of the substrate 1 in this embodiment.

Figure 6:
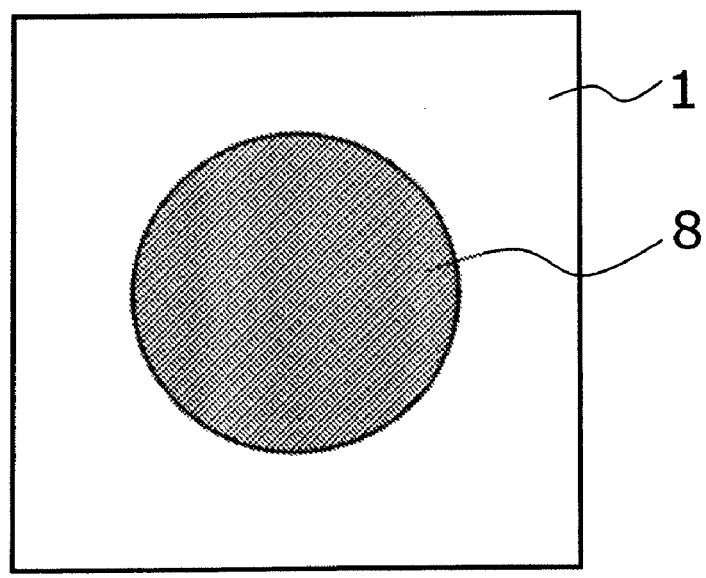
FIGS. 6 to 9 are schematic views illustrating the configuration of the rear face of the substrate 1 in the embodiment of the invention.
Figure 7:
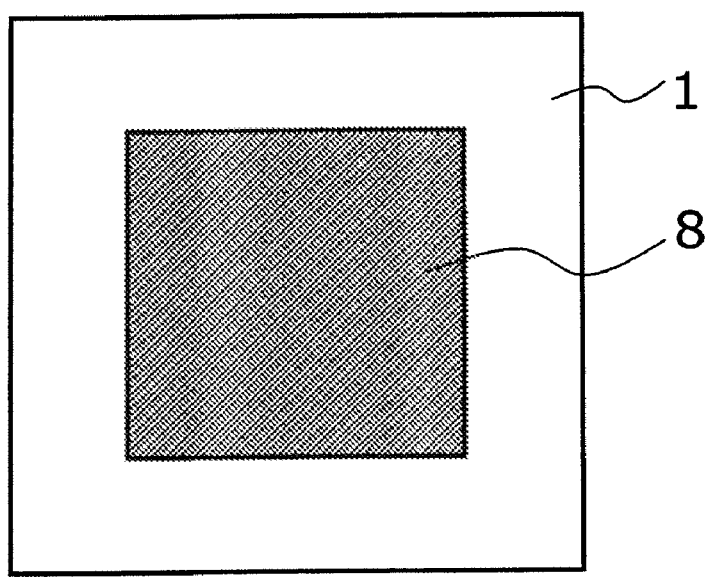
Figure 8:
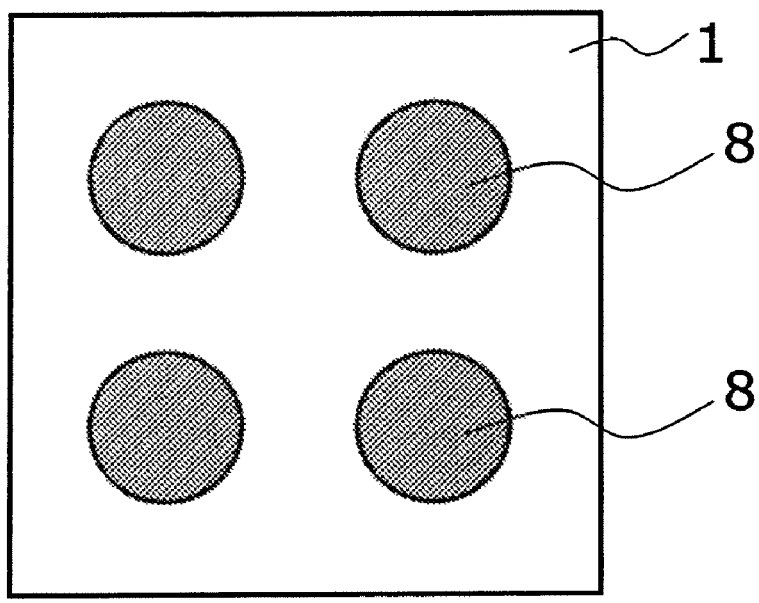

More specifically, the p-side electrode 8 may be formed near the center of the rear face of the substrate 1 in a circular shape as shown in FIG. 6, or in a square shape as shown in FIG. 7. In addition, as shown in FIG. 8, the p-side electrode 8 may be divided into a plurality of portions. Division of the electrode into a plurality of portions serves to alleviate concentration of current and to uniformly inject current into the active layer 3, which leads to light emission in a wide region.

Figure 9:
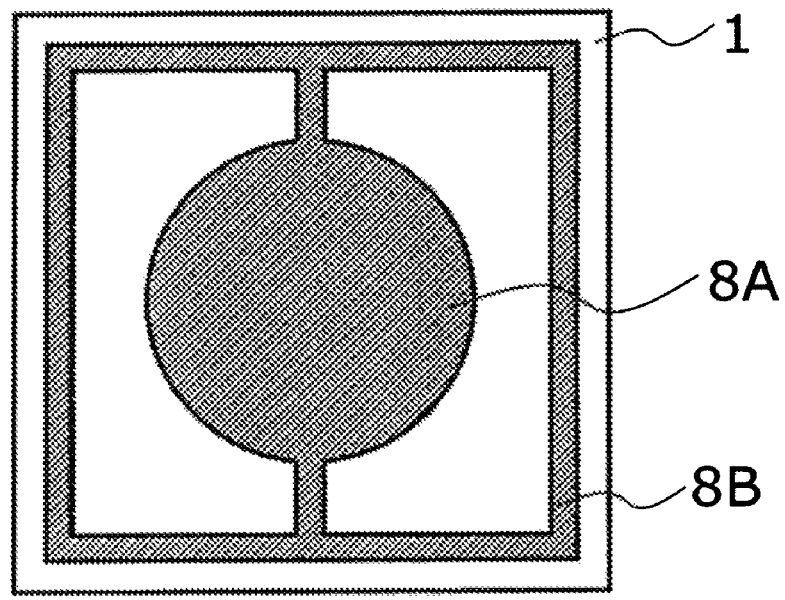

Alternatively, as shown in FIG. 9, a first portion 8A provided near the center of the rear face of the substrate 1 may be connected to a second portion 8B shaped in a thin line extending around the periphery. This can also result in uniform injection of current into the active layer 3 and light emission in a wide region.

It is to be understood that FIGS. 6 to 9 are illustrative only. For example, the p-side electrode 8 may have a pattern of polygon, ellipse, or any other shapes. Similarly, the number and arrangement thereof may be varied. Such variations are encompassed within the scope of the invention.

Figure 10:
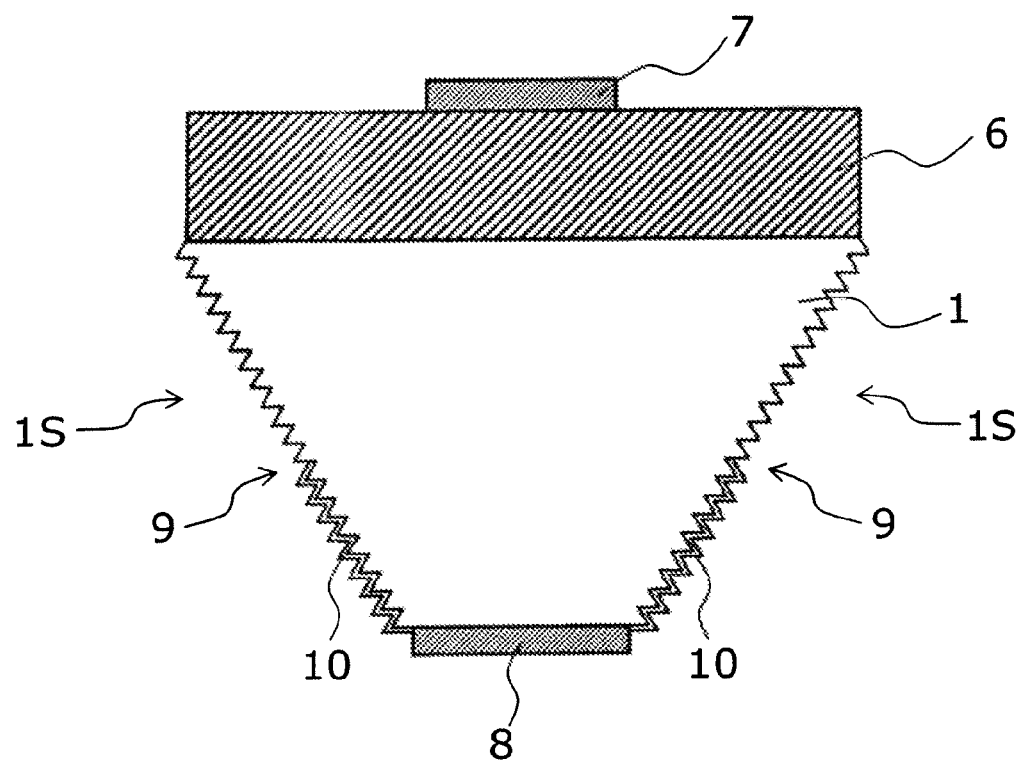
FIG. 10 is a schematic cross-sectional view showing a semiconductor light emitting device according to a variation of the embodiment of the invention.

FIG. 10 is a schematic cross-sectional view showing a semiconductor light emitting device according to a variation of this embodiment. With regard to this figure, the elements similar to those described above with reference to FIGS. 1 to 9 are marked with the same reference numerals and will not be described in detail.

In this variation, the side face 1S of the substrate 1 is tapered, and thus the substrate 1 is shaped like a truncated pyramid. A rough surface 9 is formed on the side face 1S. Furthermore, a reflective film 10 is provided on the rough surface 9 in a region extending from the bottom face of the substrate 1, that is, the lower face with a p-side electrode 8 provided thereon, to halfway the side face 1S.

The rough surface 9 not covered with the reflective film 10 has an effect of increasing light extraction efficiency.

Figure 11:
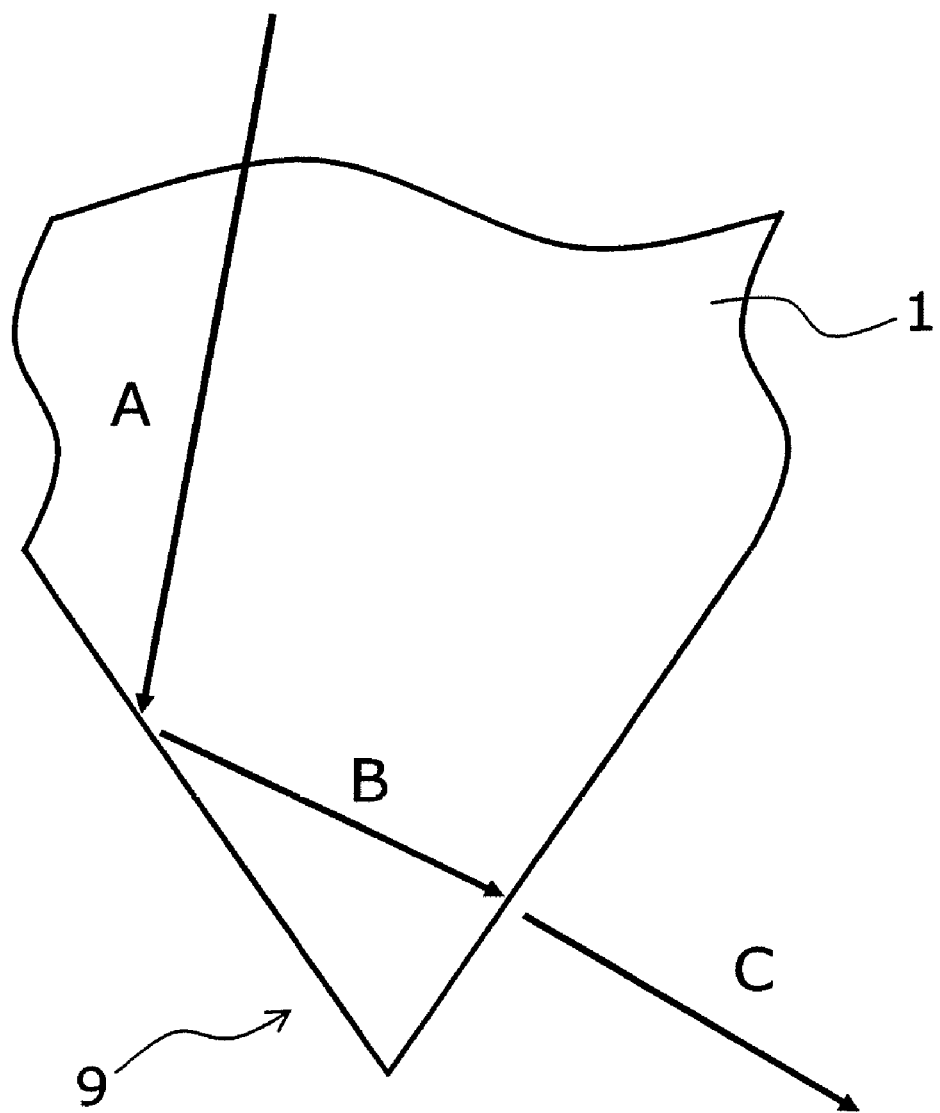
FIG. 11 is a schematic view for describing light extraction at the rough surface 9.

FIG. 11 is a schematic view for describing light extraction at the rough surface 9.

More specifically, the rough surface 9 made of pyramids is formed on the side face 1S of the substrate 1. The light traveling inside the substrate 1 along the arrow A is totally reflected along the arrow B when the light is incident on the rough surface 9 at an angle greater than the critical angle. However, this reflected light is incident on the opposed rough surface 9 at an angle less than the critical angle and can be extracted outside from the substrate 1. In this manner, when the light traveling inside the substrate 1 enters a salient portion of the rough surface 9, it is subjected to one or more total reflections and can be extracted outside as shown by the arrow C.

Figure 12:
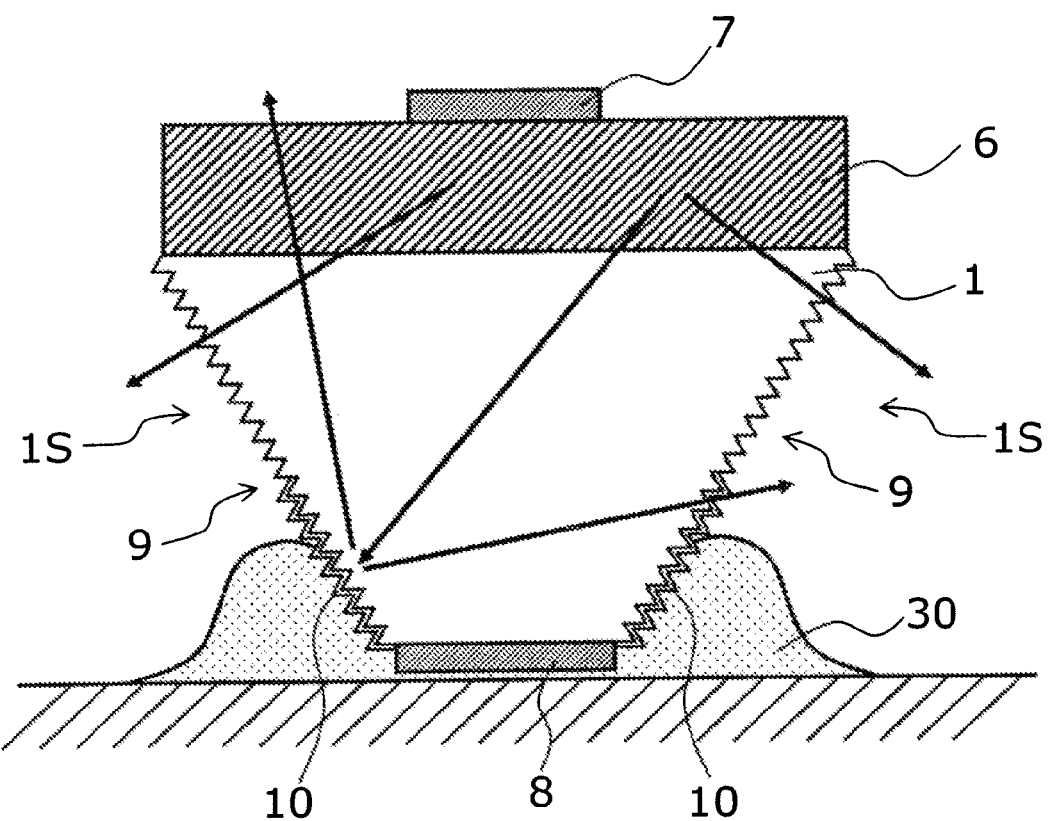
FIG. 12 is a schematic view illustrating light extraction paths in the variation of the embodiment of the invention.

FIG. 12 is a schematic view illustrating light extraction paths in this variation.

As described above with reference to FIG. 11, light can be extracted with high efficiency at the rough surface 9 not covered with the reflective film 10.

However, when this semiconductor light emitting device is mounted with an adhesive 30 such as silver paste or solder, the adhesive 30 may climb up on the side face of the chip as shown. Light cannot be extracted in the portion where the adhesive 30 climbed up in this manner. On the contrary, in this variation, light extraction is facilitated by coating the rough surface 9 with the reflective film 10 near the mounting surface of the chip. More specifically, in the region where the adhesive 30 climbs up, the light inside the chip is reflected by the reflective film 10 to allow external extraction. As a result, the light extraction efficiency can be improved.

The tapered side face 1S of the substrate 1 in this variation can be formed, for example, by dicing. More specifically, a dicing blade having a V-shaped cross section can be used to dice the substrate 1 from the rear side for forming a V-shaped groove. Alternatively, the V-shaped groove may be formed by etching. Chips are separated along the V-shaped groove thus formed to result in the tapered side face 1S. In this case, the rough surface 9 can be formed by applying the roughening treatment as described above with reference to FIG. 4B when the V-shaped grooves have been formed, or after the chips are separated.

Figure 13:
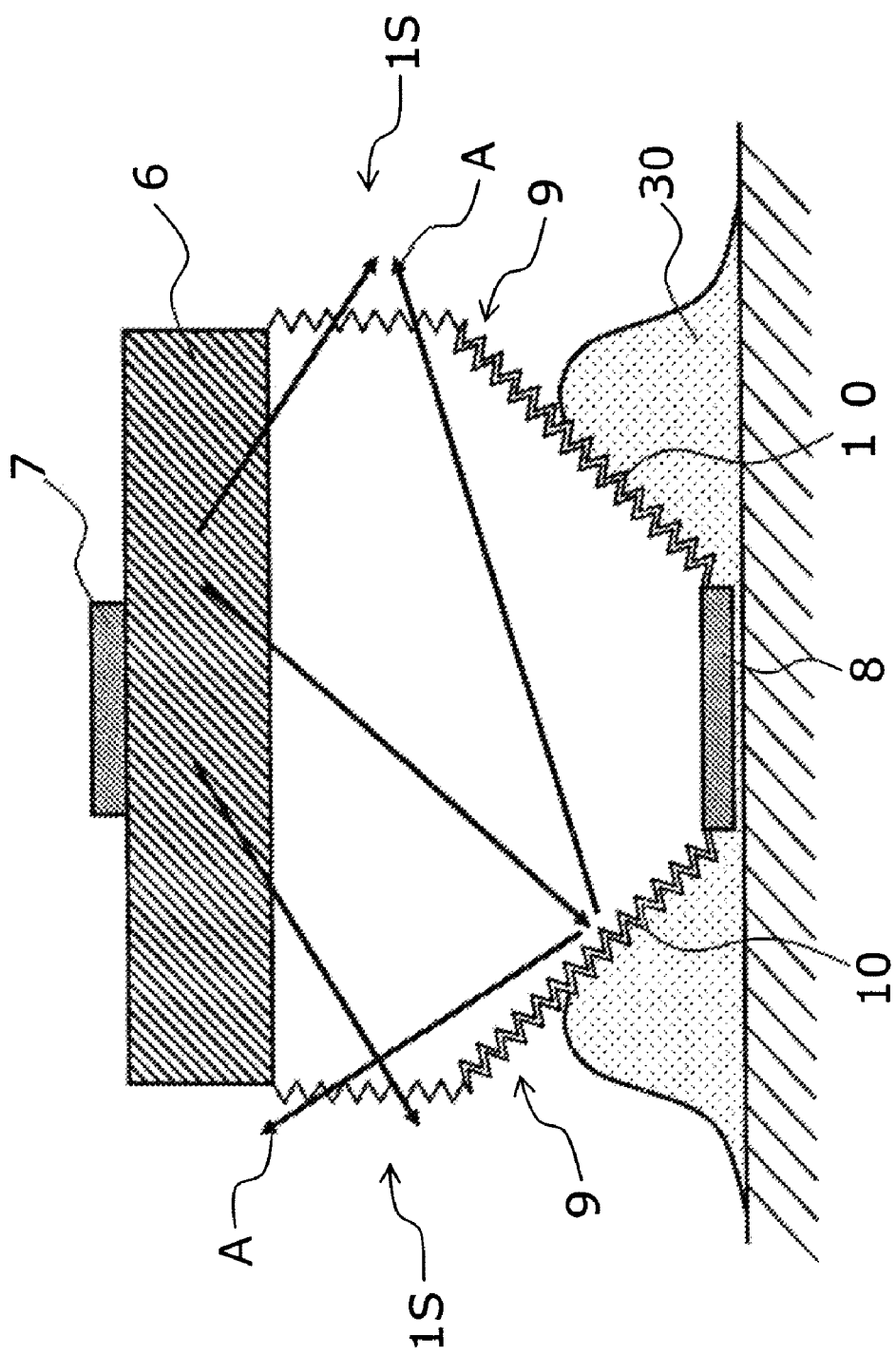
FIG. 13 is a schematic view showing a semiconductor light emitting device according to another variation of the embodiment of the invention.

FIG. 13 is a schematic view showing a semiconductor light emitting device according to another variation of this embodiment.

More specifically, in this variation, only the lower portion of the substrate 1 is tapered. A rough surface 9 is formed on the side face 1S of the substrate 1. The rough surface 9 in the tapered portion is coated with a reflective film 10.

This can avoid shielding light due to climbing up of the adhesive 30, and simultaneously help the light reflected by the reflective film 10 be incident on the vertical side face 1S as illustrated by the arrow A. As a result, the light extraction efficiency can be further increased.

The semiconductor light emitting device of this variation can be manufactured by adjusting the depth of the groove when the V-shaped grooves are formed on the rear face of the substrate 1 by using a dicing blade having a V-shaped cross section or by etching. After the V-shaped grooves are formed, a scriber or a thin dicing blade is used to cut off the remaining portion. In this way, the side face of the V-shaped groove becomes a tapered portion, and the remaining portion becomes the vertical side face.

Second Embodiment

Next, as a second embodiment of the invention, a semiconductor light emitting device having a recess on the rear face of the chip will be described.

Figure 14:
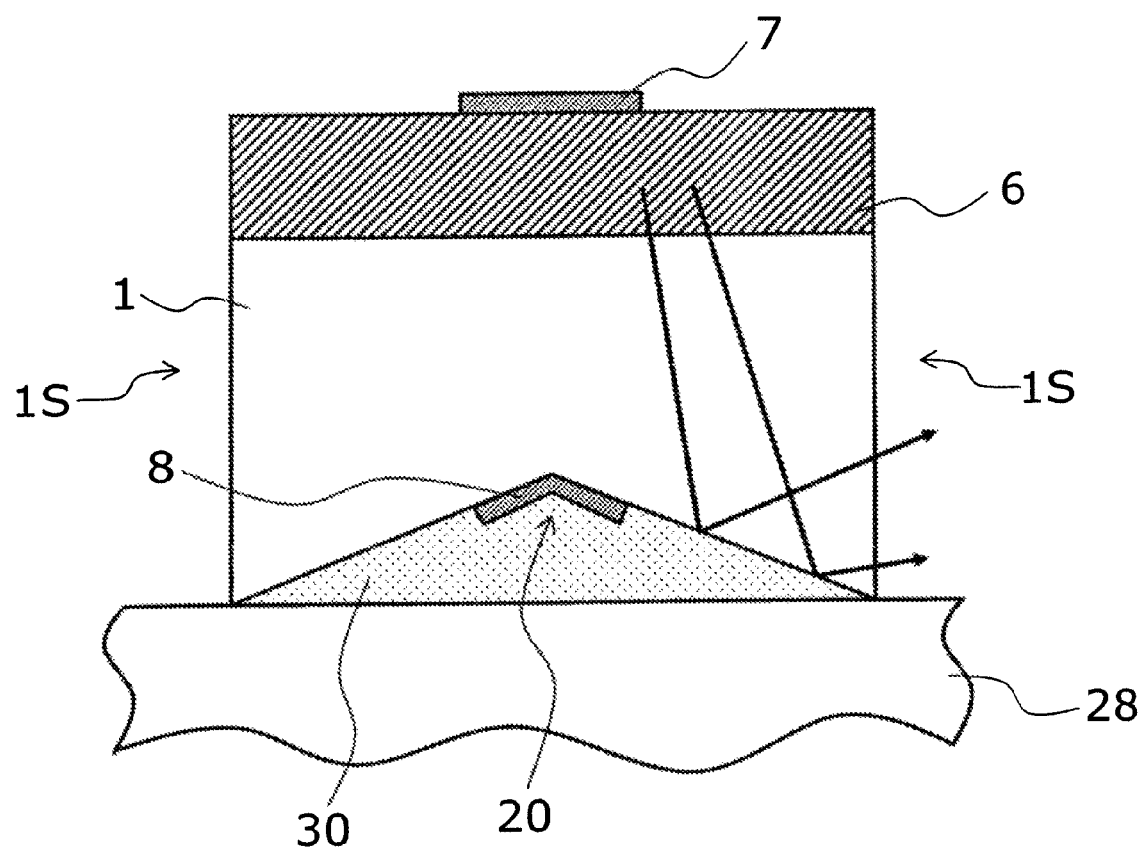
FIG. 14 is a schematic view illustrating the cross-sectional structure of a semiconductor light emitting device of the embodiment of the invention which is mounted on a packaging member.

FIG. 14 is a schematic view illustrating the cross-sectional structure of a semiconductor light emitting device of this embodiment which is mounted on a packaging member.

More specifically, the semiconductor light emitting device of this embodiment also has a substrate 1 and a semiconductor stacked structure 6. The semiconductor stacked structure 6 includes an active layer and cladding layers as appropriate, and emits light in response to injection of current via electrodes 7 and 8. The semiconductor light emitting device is mounted on a packaging member 28 such as a lead frame or mounting board with an adhesive 30.

In this embodiment, a pyramidal or conical recess 20 is provided on the rear face of the semiconductor light emitting device so as not to overlap the side face 1S of the substrate. The recess 20 may be shaped as a pyramid or a circular cone. The electrode 8 is provided, for example, near the center of the recess. Such a recess 20 can increase the light extraction efficiency. This point will be described with reference to a comparative example.

More specifically, consider a comparative example of the semiconductor light emitting device having a flat rear face where an electrode is provided near the center. When such a semiconductor light emitting device is mounted on a packaging member, an adhesive such as silver paste or solder may run off around the device and climb up on the side face of the device. It is thus impossible to extract light in the portion where the adhesive climbed up. On the other hand, the light emitted downward from the active layer is reflected by the flat rear face of the device, and the reflected light is absorbed in the active layer, which leads to a certain loss.

On the contrary, in the present embodiment, a pyramidal or conical recess 20 is provided on the rear face of the semiconductor light emitting device. Therefore, as shown in FIG. 14, the light emitted from the active layer can be reflected toward the side face 1S of the substrate and extracted outside without passing through the active layer. That is, the loss due to absorption by the active layer can be reduced.

Furthermore, the recess 20 absorbs any excess of the adhesive 30. Thus the adhesive 30 can be prevented from climbing up on the side face 1S of the device. Therefore the light reflected from the recess 20 toward the side face 1S is extracted outside without being shielded by the adhesive 30.

The side face of the recess 20 in the semiconductor light emitting device of this embodiment has an oblique angle of, for example, about 25 to 45 degrees relative to the mounting surface of the device. Such a recess 20 can be formed by, for example, dry etching or laser processing.

FIGS. 15A to 15C and 16A to 16C are process cross-sectional views illustrating a formation process by dry etching.

Figure 15A:
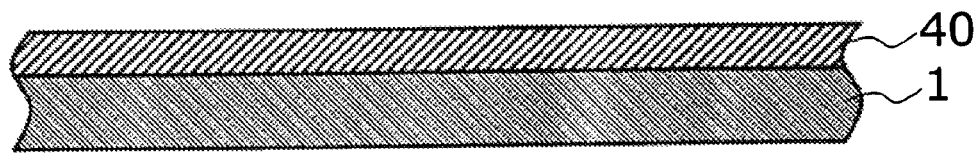
FIGS. 15A to 15C and 16A to 16C are process cross-sectional views illustrating a formation process by dry etching.

More specifically, first, as shown in FIG. 15A, a mask layer 40 made of relatively soft material such as resist is formed on the rear face of the substrate 1 where a recess is to be formed.

Figure 15B:
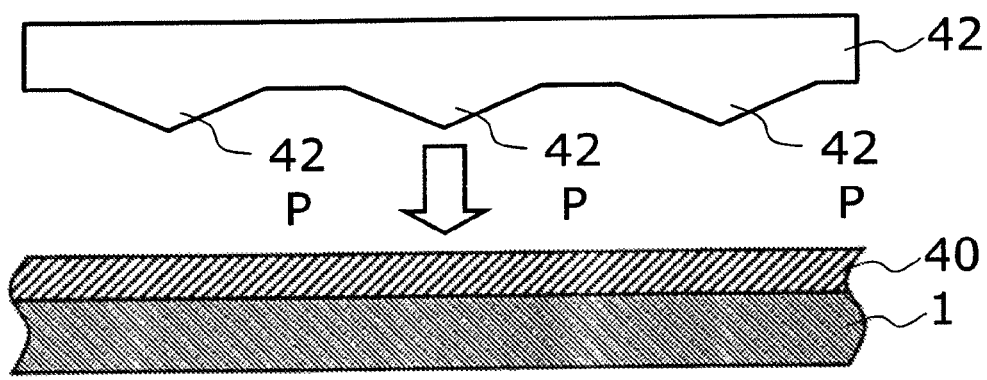

Next, as shown in FIG. 15B, a press 42 is forced on the mask layer 40. The press 42 has protrusions 42P each corresponding to the recess 20 to be formed.

Figure 15C:
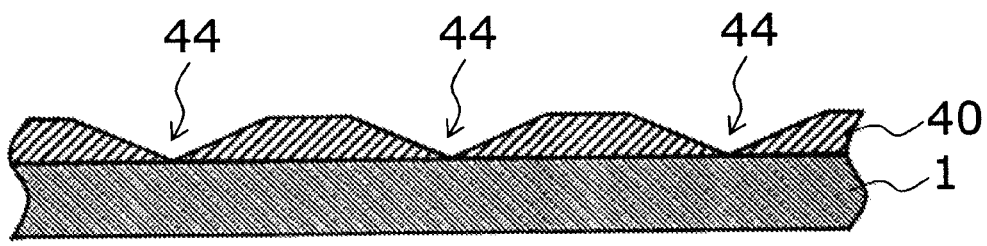

Forced by the press 42, as shown in FIG. 15C, recesses 44 corresponding to the protrusions 42P are formed on the mask layer 40.

Figure 16A:
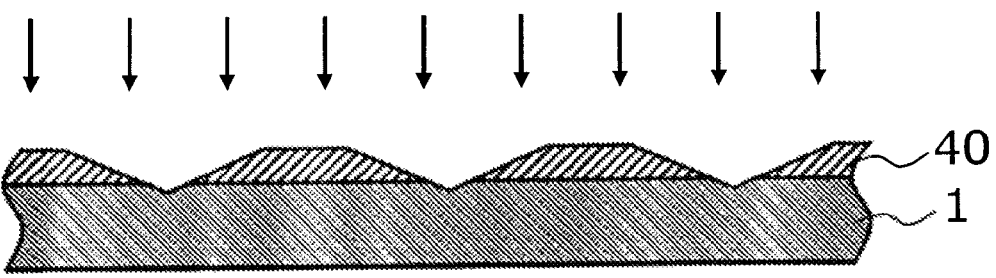
Figure 16B:
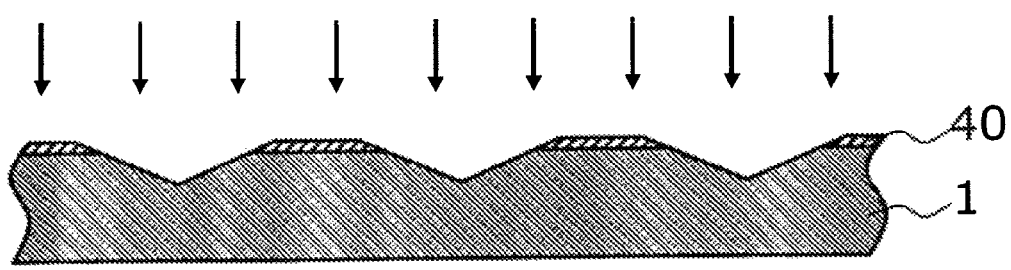
Figure 16C:
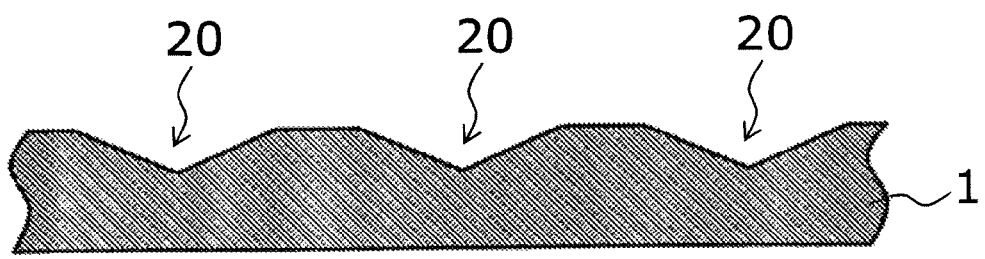

Next, as shown in FIG. 16A, anisotropic etching such as ion milling or RIE (reactive ion etching) is used to etch the mask layer 40 from above. The etching pattern of the mask layer 40 is then transferred to the underlying substrate 1. Etching of the mask layer 40 proceeds as shown in FIG. 16B. When the mask layer 40 is completely etched as shown in FIG. 16C, the recesses 20 have been formed on the surface of the underlying substrate 1.

As an alternative to the process described above, for example, laser processing may be used to form a recess 20 on the rear face of the substrate 1. In this case, the rear face of the substrate 1 is irradiated with a scanned laser beam to successively etch a certain amount. A pyramidal or conical recess 20 can be formed by gradually reducing the scanning field of the laser beam.

Figure 17:
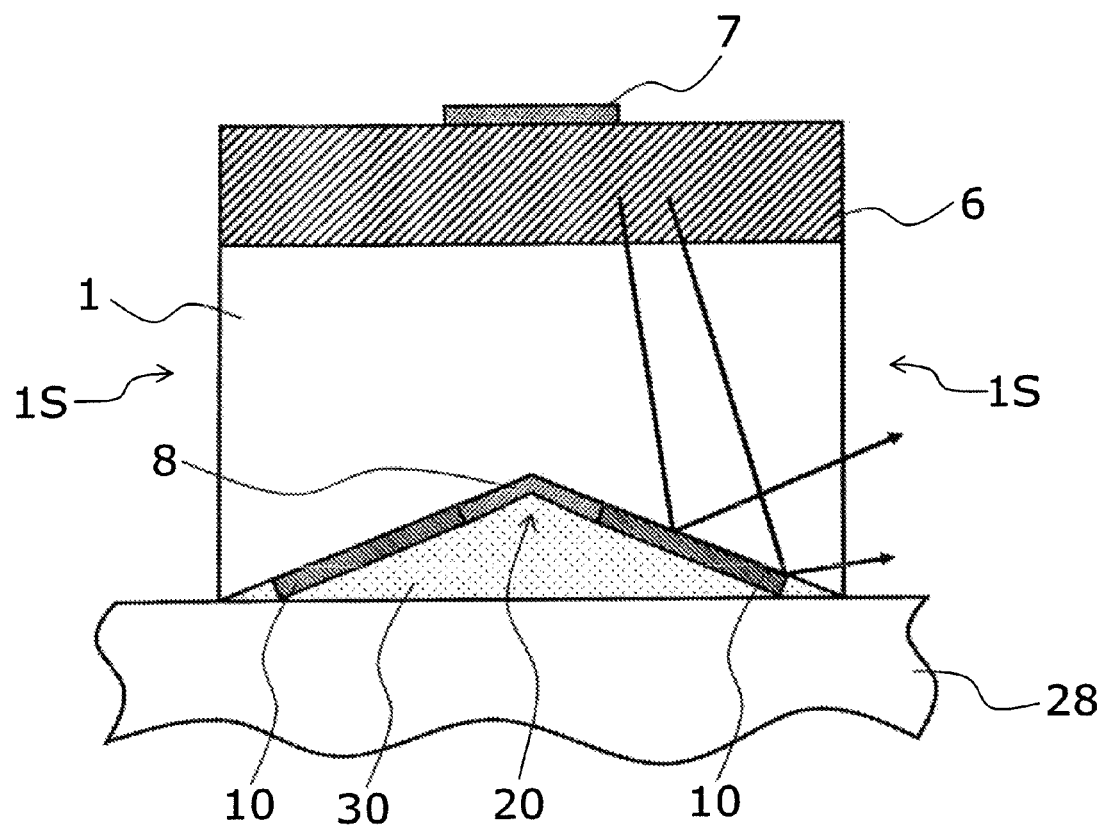
FIG. 17 is a schematic cross-sectional view showing a semiconductor light emitting device according to a variation of the embodiment of the invention.

FIG. 17 is a schematic cross-sectional view showing a semiconductor light emitting device according to a variation of the present embodiment.

In this variation, the portion of the recess 20 outside the electrode 8 is coated with a reflective film 10. The reflective film 10 may be any one of the various films described above with reference to the first embodiment.

The reflective film 10 can further increase light reflectance at the recess 20. As a result, the light emitted downward from the active layer can be reflected with high efficiency and extracted outside via the side face 1S.

Furthermore, in this embodiment, a rough surface as described above with reference to FIG. 11 may be provided on the side face 1S.

Third Embodiment

Next, as a third embodiment of the invention, a semiconductor light emitting device having a reduced loss of light below the bonding pad will be described.

Figure 18:
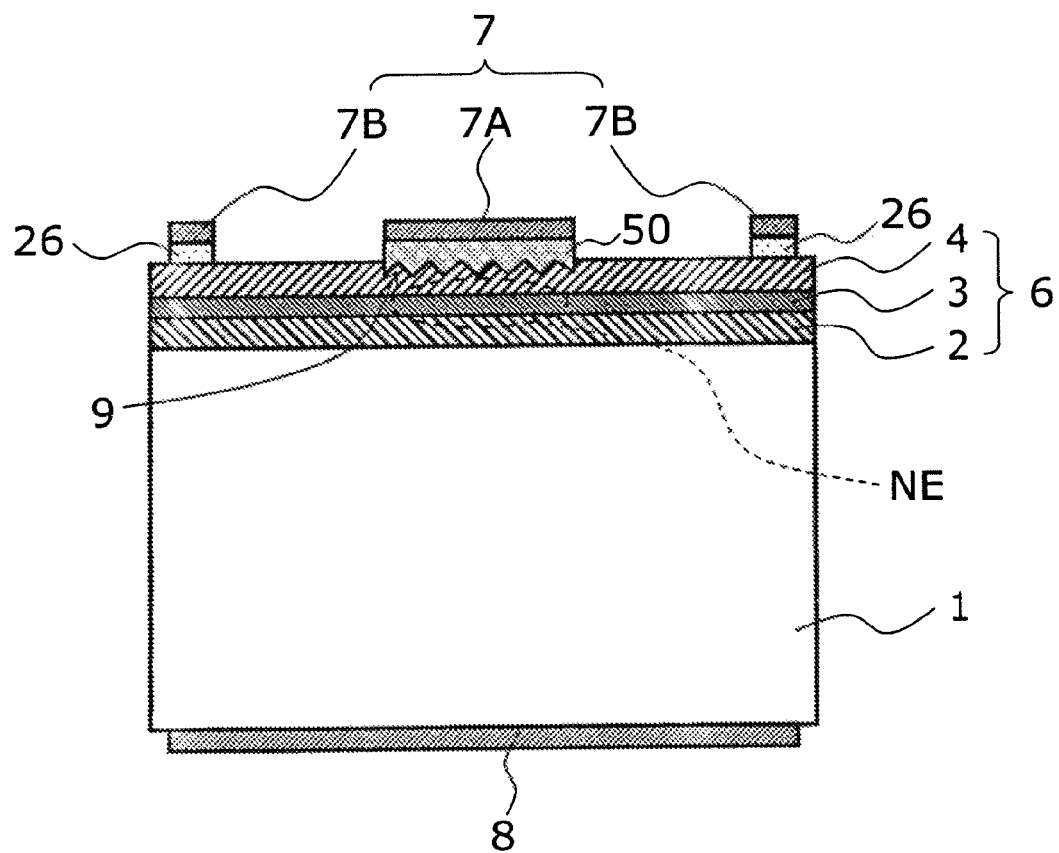
FIG. 18 is a schematic view illustrating the cross-sectional structure of a semiconductor light emitting device according to the embodiment of the invention.

FIG. 18 is a schematic view illustrating the cross-sectional structure of a semiconductor light emitting device according to this embodiment.

Figure 19:
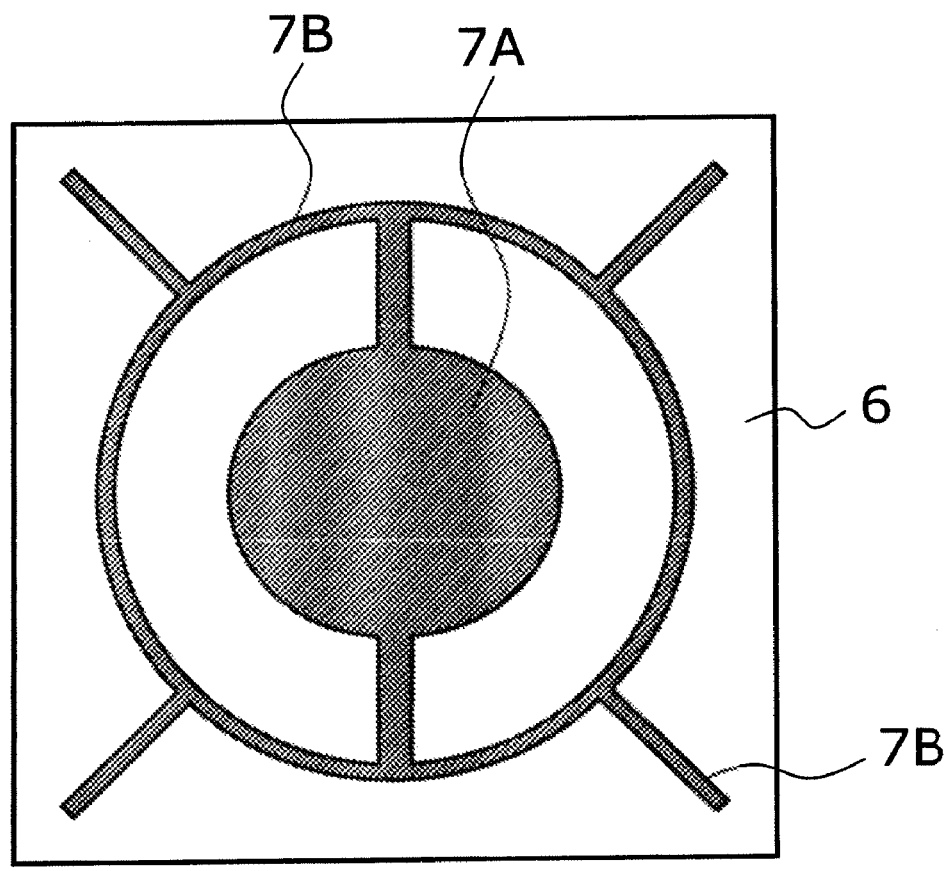
FIG. 19 is a plan view illustrating an electrode pattern formed on the surface of the semiconductor light emitting device.

FIG. 19 is a plan view illustrating an electrode pattern formed on the surface of this semiconductor light emitting device.

With regard to these figures again, the elements similar to those described above with reference to FIGS. 1 to 17 are marked with the same reference numerals and will not be described in detail.

In this embodiment, the electrode 7 formed on the semiconductor stacked structure 6 has a bonding pad 7A and a thin line electrode portion 7B connected thereto. The bonding pad 7A is a connecting portion for gold wire or the like that is connected to an external circuit (not shown). The thin line electrode portion 7B is a portion for electrical contact with the semiconductor layer via an ohmic GaAs layer 26. The chip may measure generally 200 micrometers to 1 millimeter per side. The bonding pad 7A may have a diameter of generally 100 to 150 micrometers. The thin line electrode portion 7B may have a line width of generally 2 to 10 micrometers.

In this embodiment, a rough surface 9 is formed on the surface of the semiconductor stacked structure 6 below the bonding pad 7A, and a dielectric layer 50 is provided thereon. The rough surface 9 may be similar to that described above with reference to the first embodiment. The dielectric layer 50 may be formed by, for example, SOG (spin on glass). Such structure below the bonding pad 7A can improve the extraction efficiency for light from the semiconductor light emitting device. This point will be described with reference to a comparative example.

Figure 20:
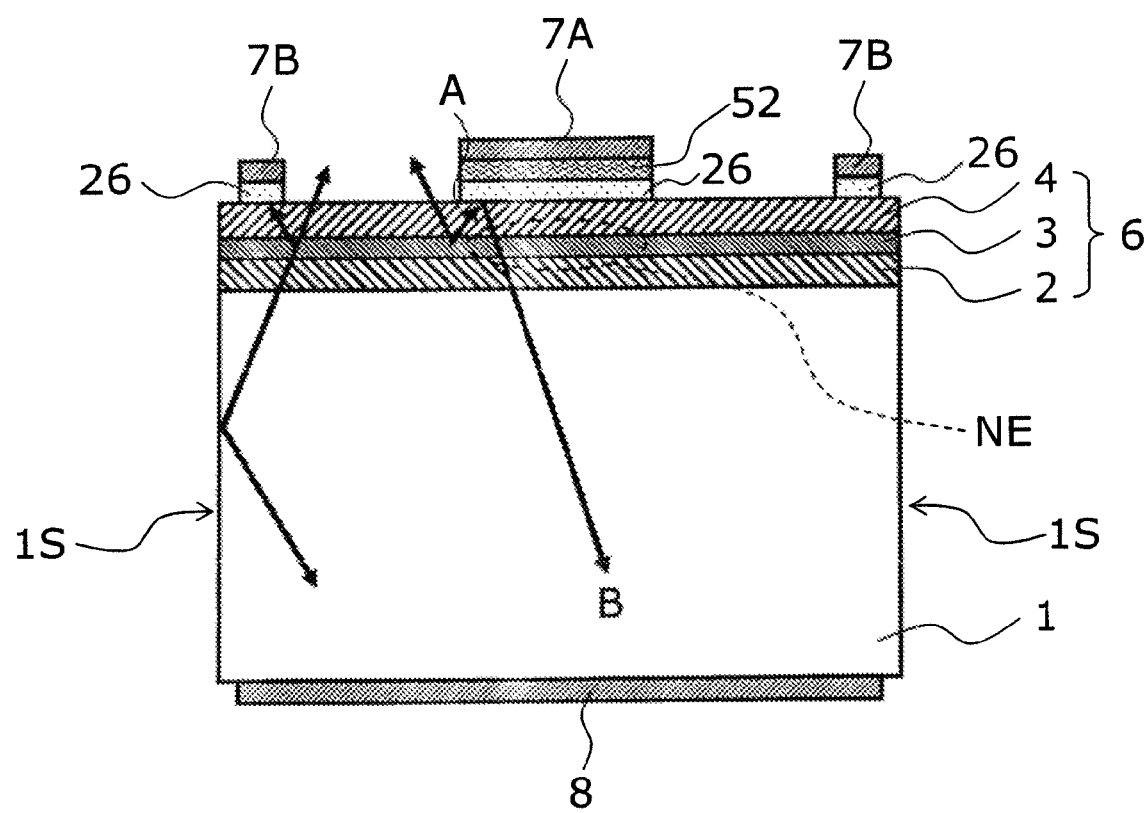
FIG. 20 is a schematic cross-sectional view of a semiconductor light emitting device investigated by the inventors in the course of reaching the invention.

FIG. 20 is a schematic cross-sectional view of a semiconductor light emitting device investigated by the inventors in the course of reaching the invention.

In this comparative example, the semiconductor stacked structure 6 has a flat surface, on which a current block layer 52 made of semiconductor is provided. For example, when the semiconductor stacked structure 6 is made of InGaAlP-based compound semiconductor that emits red light, the current block layer 52 may be made of non-doped InGaP or the like. The current block layer 52 serves to block the injection of current from the bonding pad 7A into the underlying semiconductor layer. That is, it is difficult to extract externally the light emitted below the bonding pad 7A because it is shielded by the bonding pad 7A. For this reason, the current block layer 52 is provided to turn the portion below the bonding pad 7A into a non-emitting region NE.

However, the structure of this comparative example has a problem that, when the light emitted by current injection from the thin line electrode region 7B is directed below the bonding pad 7A as shown by the arrow A, it is absorbed by the GaAs contact layer 26 to result in a certain loss. In addition, the light reflected below the bonding pad 7A travels toward the opposed electrode 8 as shown by the arrow B, and is absorbed in the alloyed region formed in the vicinity of the electrode 8, which leads to another loss. Furthermore, since the light emitted below the thin line electrode 7B is incident on the side face 1S of the substrate 1 at a relatively large incident angle, it is prone to total reflection at the side face 1S. This causes another problem of decreasing light extraction efficiency.

On the contrary, in the present embodiment, first, a dielectric layer 50 is provided below the bonding pad 7A, which has a current blocking effect and an effect of increasing reflectance. More specifically, since the dielectric layer 50 is insulator, it can definitely block current and ensure that light emission below the bonding pad 7A is reduced.

Furthermore, the dielectric layer 50 serves to reflect the light emitted from the active layer 3 with high efficiency. For example, if the dielectric layer 50 is made of silicon oxide, and assuming that the underlying InGaAlP layer has a refractive index of n=3.2 and silicon oxide has a refractive index of n=1.45, then the critical angle for total reflection at the interface therebetween is as small as about 27 degrees. That is, of the light emitted from the active layer and being incident on the dielectric layer 50, the light having an incident angle above 27 degrees is totally reflected. Additionally, in this case, the light having an incident angle below 27 degrees is also subjected to about 14% reflection. In this way, the dielectric layer 50 serves to reflect the light emitted from the active layer 3 with high efficiency.

Figure 21:
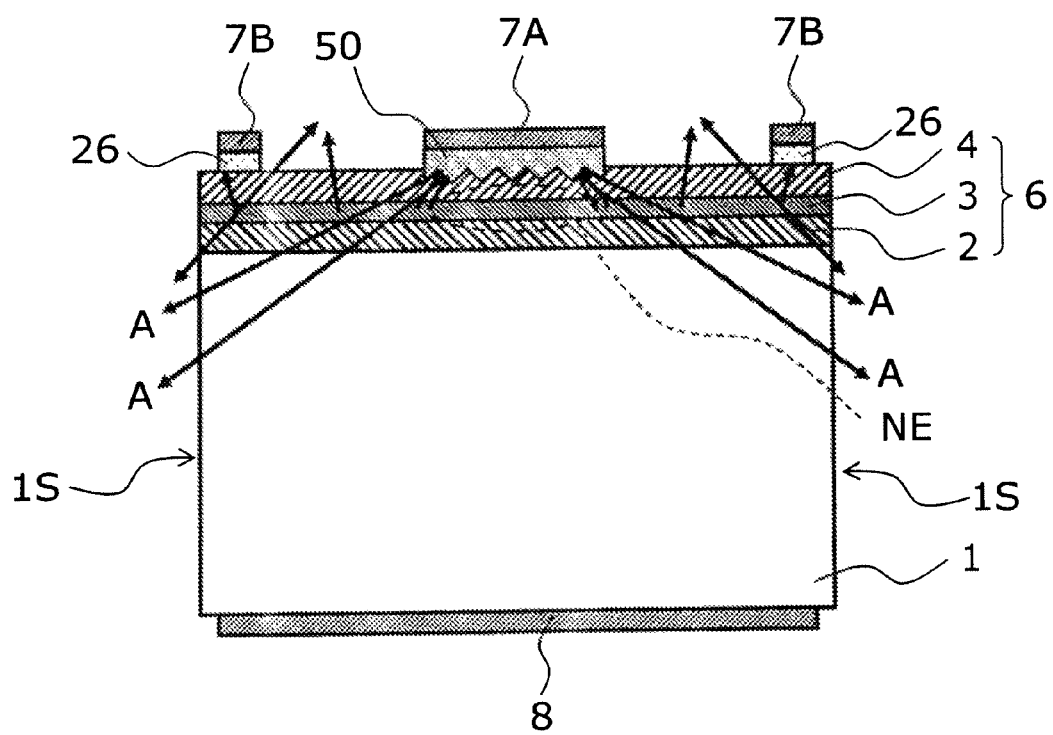
FIG. 21 is a schematic view illustrating a situation where the light scattered below the bonding pad 7A is reflected toward the side face of the device and extracted outside.

Furthermore, according to this embodiment, a rough surface 9 can be provided on the surface of the semiconductor stacked structure 6 to scatter light. As a result, as shown in FIG. 21 by the arrow A, the light scattered below the bonding pad 7A can be reflected toward the side face 1S of the device and extracted outside.

Figure 22:
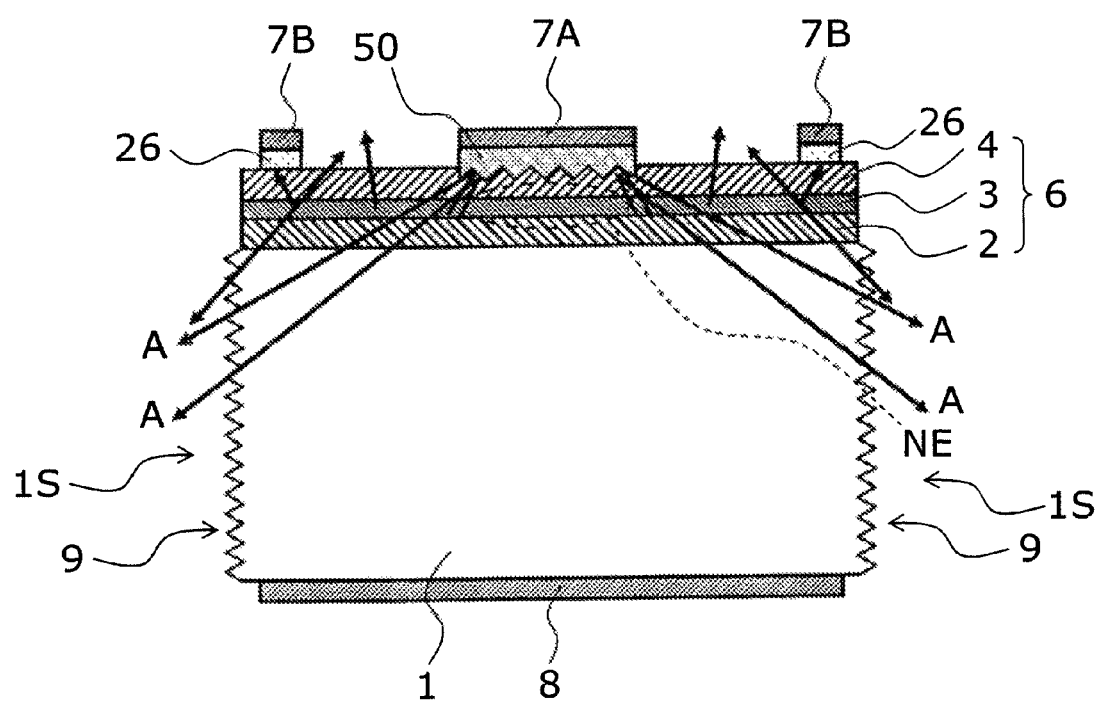
FIG. 22 is a schematic cross-sectional view showing a semiconductor light emitting device according to a variation of the embodiment of the invention.

FIG. 22 is a schematic cross-sectional view showing a semiconductor light emitting device according to a variation of this embodiment.

More specifically, in this variation, a rough surface 9 is provided on the side face 1S of the substrate 1. Such a rough surface 9 serves to increase the light extraction efficiency by taking advantage of multiple reflections as described above with reference to FIG. 11. That is, the light emitted below the thin line electrode portion 7B or the light scattered at the rough surface 9 below the bonding pad 7A can be extracted via the side face 1S with high efficiency.

Figure 23:
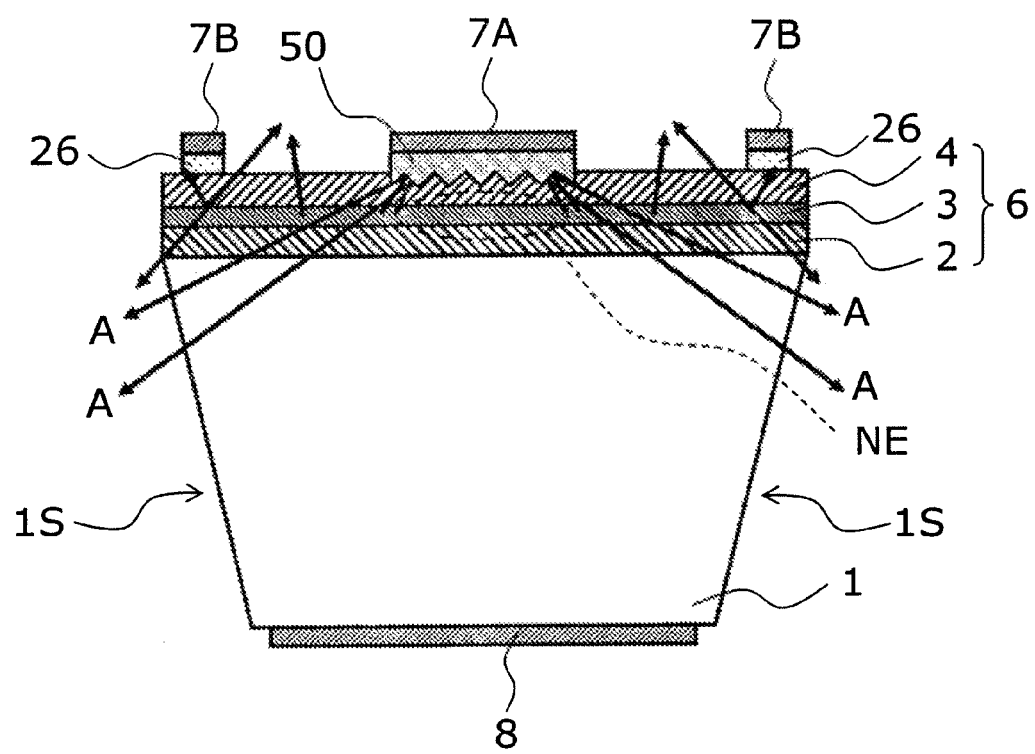
FIG. 23 is a schematic cross-sectional view showing a semiconductor light emitting device according to a second variation of the embodiment of the invention.

FIG. 23 is a schematic cross-sectional view showing a semiconductor light emitting device according to a second variation of this embodiment.

More specifically, in this variation, the side face 1S of the substrate 1 is tapered. This enables the light emitted below the thin line electrode portion 7B or the light reflected below the bonding pad 7A to be incident on the side face 1S at a smaller incident angle. As a result, total reflection at the side face 1S can be reduced to further increase the light extraction efficiency. Additionally, in this variation, a rough surface 9 similar to that shown in FIG. 22 may be provided on the side face 1S.

Fourth Embodiment

Next, as a fourth embodiment of the invention, a semiconductor light emitting device having an improved extraction efficiency for light from below the bonding pad will be described.

Figure 24:
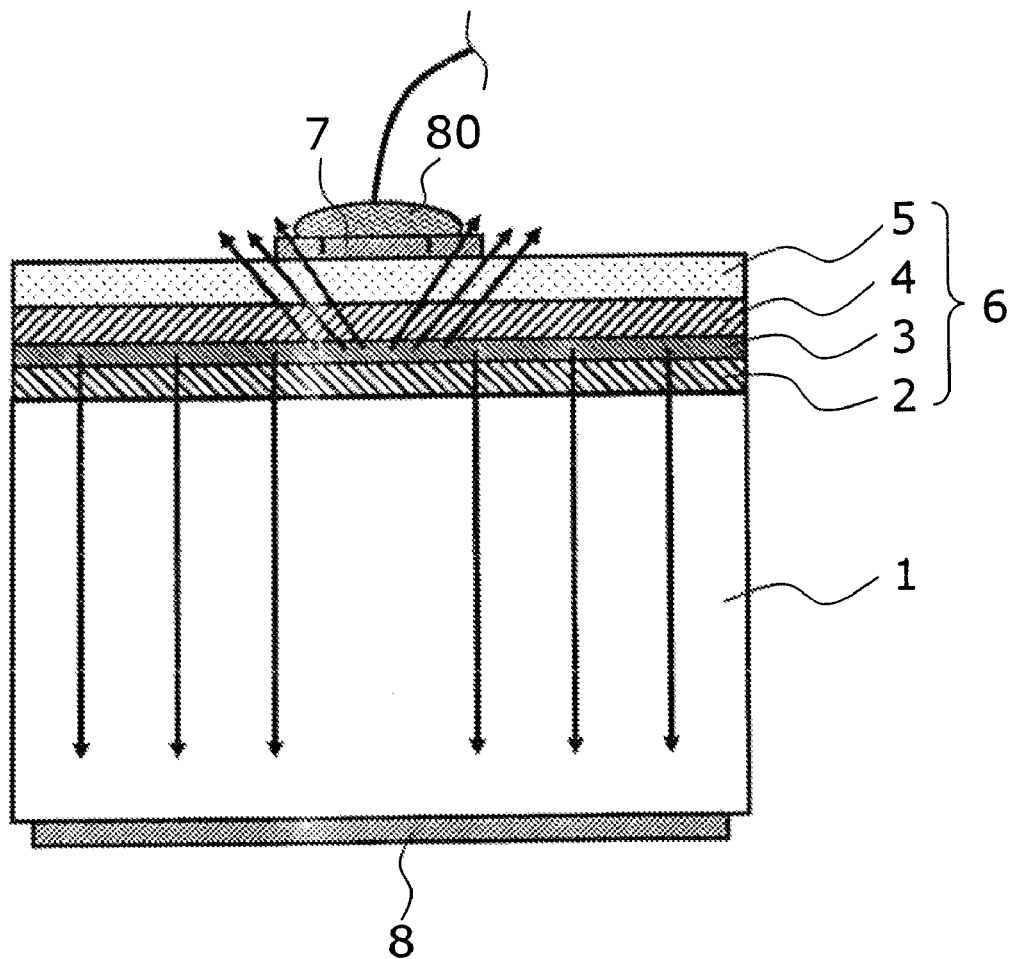
FIG. 24 is a schematic view illustrating the cross-sectional structure of a semiconductor light emitting device of the embodiment of the invention.

FIG. 24 is a schematic view illustrating the cross-sectional structure of a semiconductor light emitting device of this embodiment.

Figure 25:
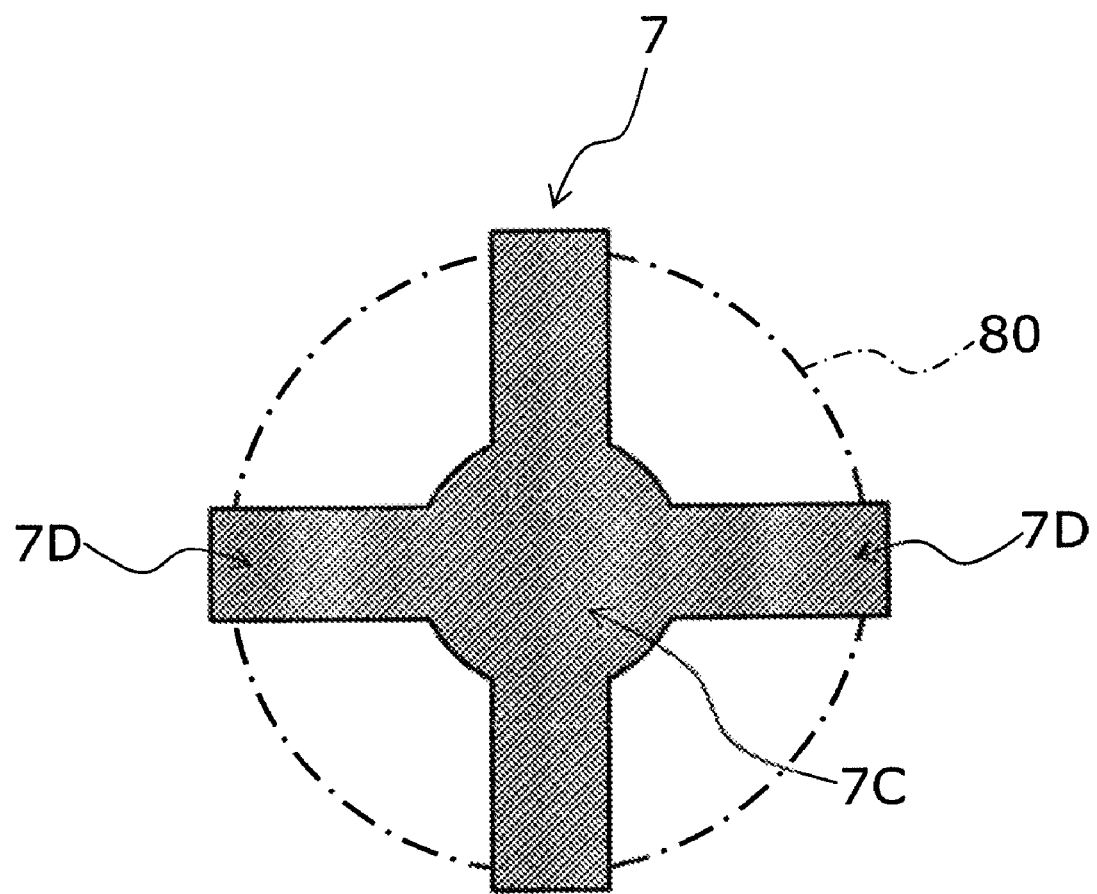
FIG. 25 is an enlarged view of a bonding pad portion of the semiconductor light emitting device.

FIG. 25 is an enlarged view of a bonding pad portion of this semiconductor light emitting device. With regard to these figures, the elements similar to those described above with reference to FIGS. 1 to 23 are marked with the same reference numerals and will not be described in detail.

In this embodiment, the electrode 7 formed on the top face of the device is composed of a bonding pad 7C and extended electrode portions 7D. However, the bonding pad 7C has a smaller pattern area than a fusion bonding portion 80 for gold (Au) or other wire to be connected thereto. For example, when a gold wire having a diameter of about 20 to 30 micrometers is ball bonded, the fusion bonding portion 80 will have a generally circular shape having a diameter of about 80 to 120 micrometers. In contrast, the diameter of the bonding pad 7C of the light emitting device of this embodiment is set to, for example, about 40 to 70 micrometers. In addition, extended electrode portions 7D are extended from the bonding pad 7C in order to secure strength against wire bonding and to diffuse current over a wide range. The structure below the bonding pad 7C and the extended electrode portions 7D is made to allow current injection via a contact layer or the like (not shown).

Figure 26:
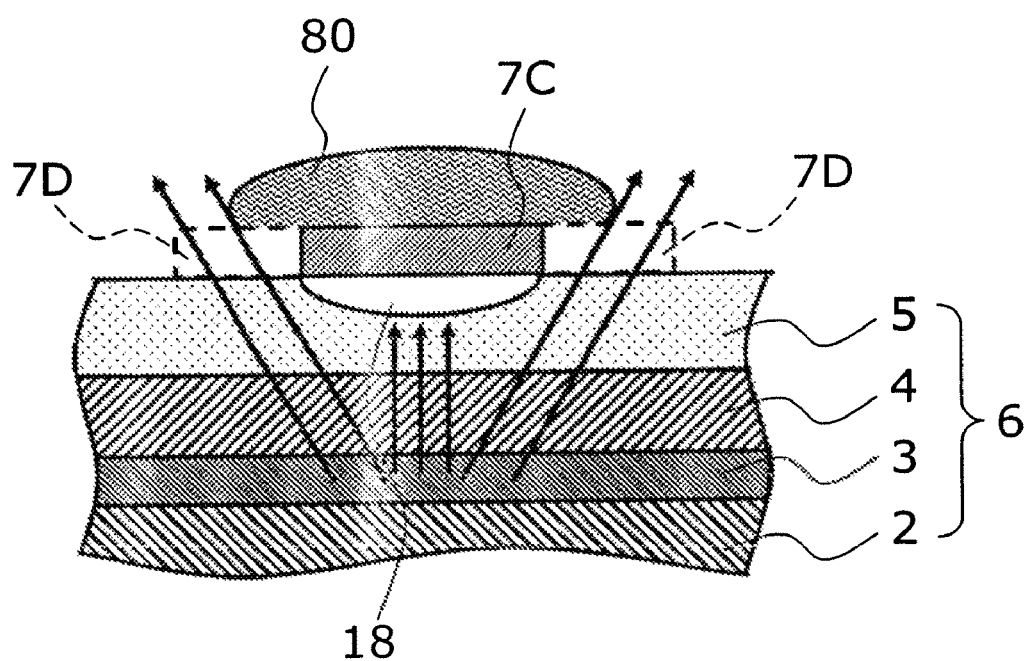
FIG. 26 is a schematic view illustrating a situation where part of the light emitted below the fusion bonding portion 80 is extracted outside through a gap between the extended electrode portions 7D.

FIG. 26 is a schematic view illustrating a situation where part of the light emitted below the fusion bonding portion 80 is extracted outside through a gap between the extended electrodes 7D.

Typically, the light emitted below the bonding pad 7C is shielded by the bonding pad 7C and cannot be directly extracted outside. In addition, in a structure where current is injected into a semiconductor layer below the bonding pad 7C, an alloyed region 18 of metal and semiconductor is formed below the bonding pad 7C. Absorption of light emission by this alloyed region 18 leads to a certain loss. Therefore the bonding pad 7C formed larger than the size of the wire fusion bonding portion 80 decreases the light extraction efficiency.

In contrast, according to this embodiment, the size of the bonding pad 7C is made smaller than the wire fusion bonding portion 80. As shown in FIG. 26, this enables part of the light emitted below the fusion bonding portion 80 to be extracted outside through a gap between the extended electrode portions 7D. Therefore, in this embodiment, the substrate 1 does not necessarily need to be transparent to the light emitted from the active layer 3. Of course, this embodiment has a similar advantageous effect when applied to a semiconductor light emitting device having a transparent substrate 1.

Figure 27:
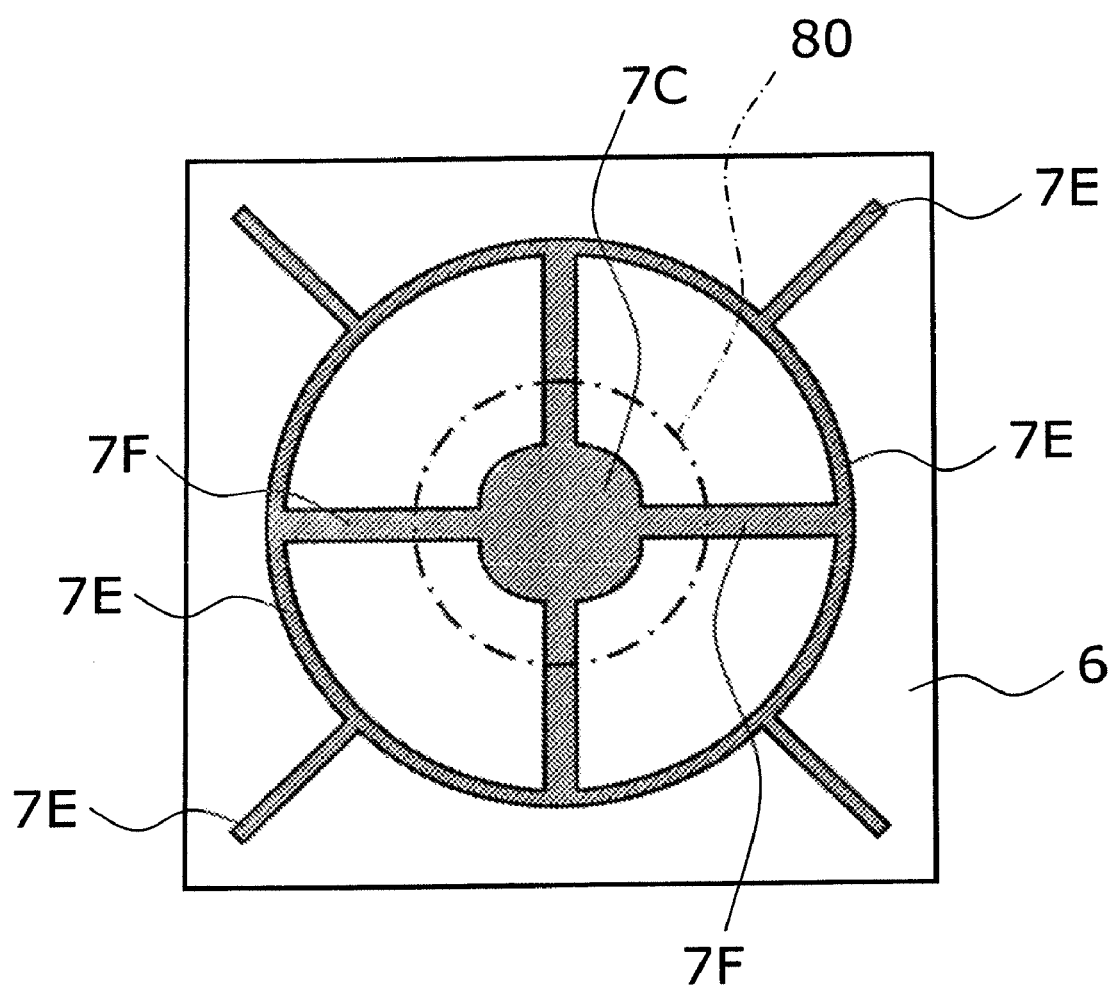
FIG. 27 is a schematic view illustrating an electrode pattern in the embodiment of the invention.

FIG. 27 is a schematic view illustrating an electrode pattern in this embodiment.

More specifically, a bonding pad 7C smaller than the wire fusion bonding portion 80 is provided. Extended electrode portions 7F having a narrow width are radially connected to the bonding pad 7C. The light emitted below the fusion bonding portion 80 can be extracted outside between the extended electrode portions 7F. In addition, thin line electrode portions 7E having an even narrower width can be extended to the periphery of the chip to uniformly inject current over a wide range and produce light emission.

Figure 28:
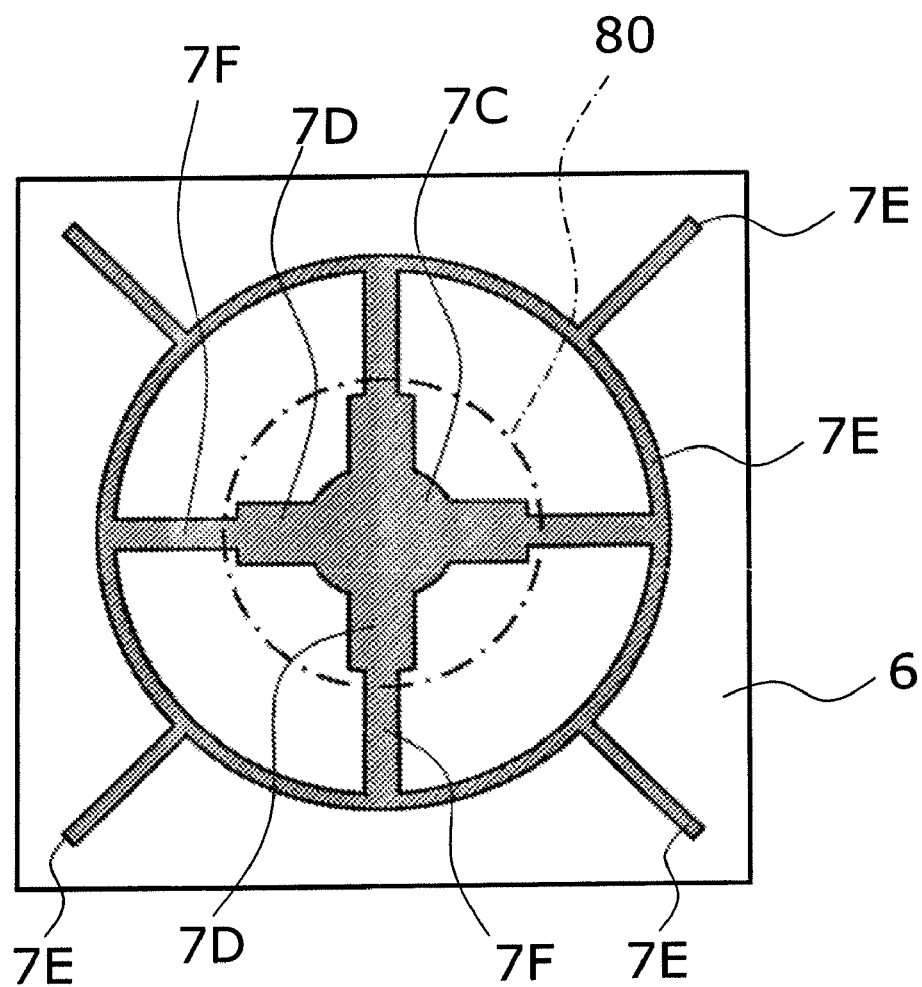
FIG. 28 is a schematic view showing another example electrode pattern in the embodiment of the invention.

FIG. 28 is a schematic view showing another example electrode pattern in this embodiment.

More specifically, in this example, extended electrode portions 7D having a wider width are formed below the fusion bonding portion 80, and extended electrode portions 7F having a narrower width are formed otherwise. Formation of extended electrode portions 7D having a wider width below the fusion bonding portion 80 facilitates increasing strength against wire bonding. That is, semiconductor layers can be protected more definitely against pressure, ultrasonic waves, and the like applied during wire bonding. In addition, formation of extended electrode portions 7F having a narrow width and thin line electrode portions 7E having an even narrower width outside the fusion bonding portion 80 serves to uniformly inject current over a wide range and to extract light emission at high efficiency without shielding.

Figure 29A:
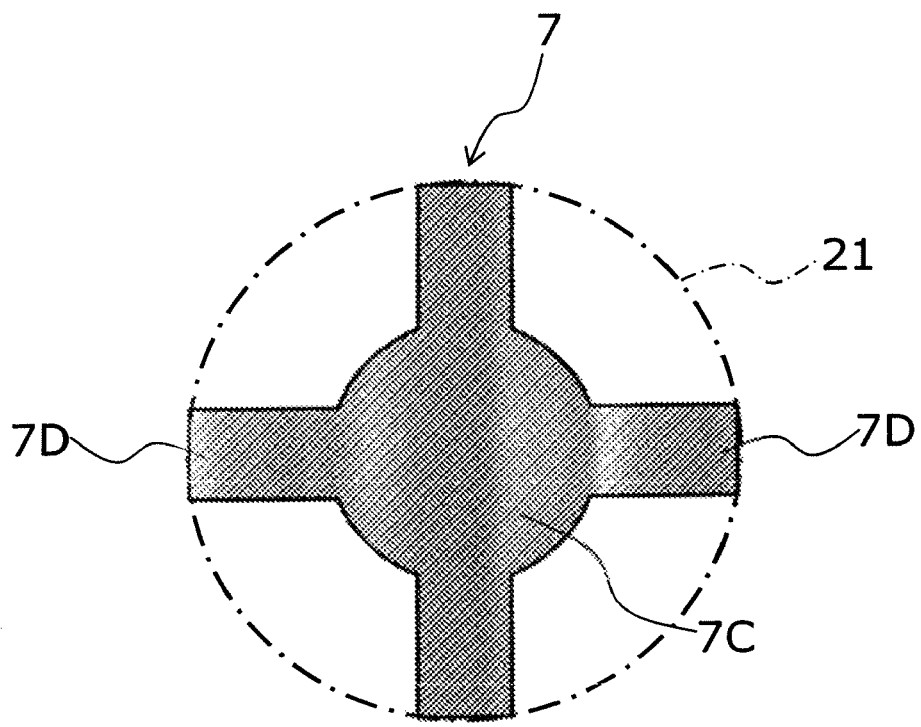
FIGS. 29A and 29B are schematic views showing a semiconductor light emitting device according to a variation of the embodiment of the invention.
Figure 29B:
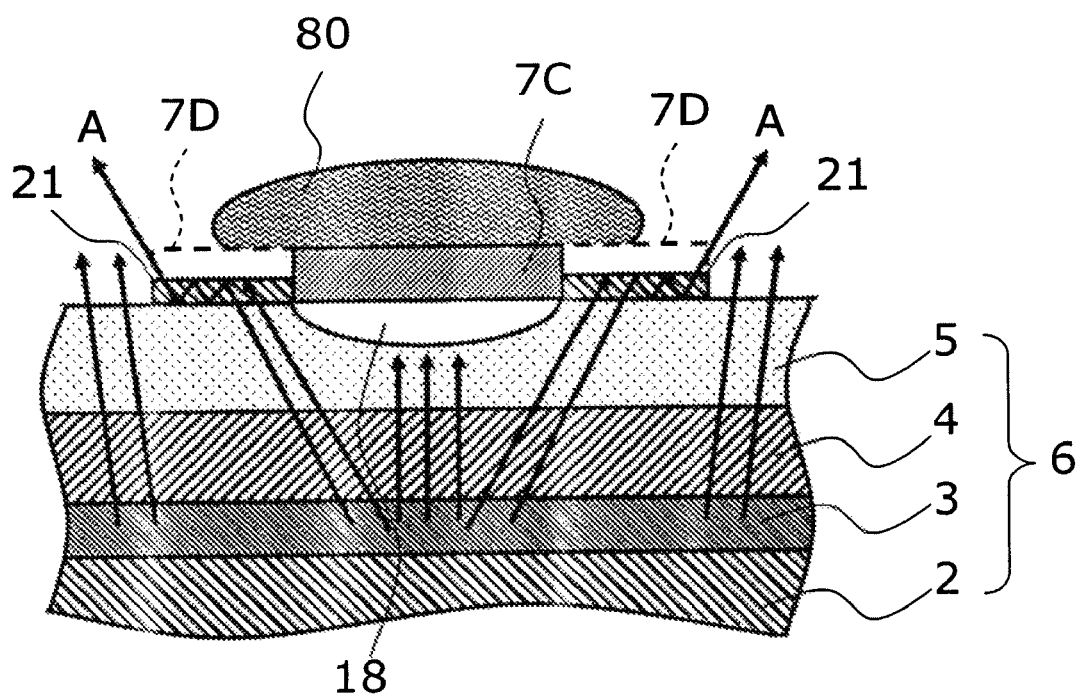

FIG. 29A is an enlarged schematic plan view showing the electrode 7 of the semiconductor light emitting device according to a variation of this embodiment, and FIG. 29B is a schematic cross-sectional view thereof.

More specifically, in this variation, the surface of the semiconductor layer below the fusion bonding portion 80 (e.g., the fusion bonding portion 80 shown by a dot-dashed line in FIGS. 27 and 28) outside the electrode 7 (extended electrode portions 7D and 7F, bonding pad 7C, etc.) is covered with a transparent film 21 being translucent to light emission. Such a transparent film 21 serves to increase strength against wire bonding. It also serves to protect the semiconductor layer when the semiconductor light emitting device is sealed with resin. Furthermore, the transparent film 21 allows part of the light emitted below the bonding pad 7C to be extracted outside more efficiently. That is, as shown in FIG. 29B by the arrow A, the light emitted below the bonding pad 7C can be made incident on the transparent film 21 and reflected at the surface of the transparent film 21 to propagate in the transparent film 21. In this way, the light emitted below the fusion bonding portion 80 can be extracted by propagating in the transparent film 21.

In this case, the transparent film 21 is preferably formed from material having a smaller refractive index than the transparent resin (having a refractive index of about 1.5) for sealing the light emitting device. Such a transparent film 21 can be formed by, for example, the SOG (Spin On Glass) method. In the SOG method, liquid SOG raw material based on, for example, inorganic silicates or organic silicates such as methyl siloxanes is applied to the surface of a wafer using the spin coating method. Subsequently, a transparent silicon oxide film can be obtained by, for example, applying heat treatment at 300 to 400° C. The silicon oxide film thus obtained has a refractive index of 1.4 or less, which can be used as a transparent film 21 in this variation.

Furthermore, the strength against wire bonding can be increased when the transparent film 21 and the electrode 7 have a comparable thickness. However, the advantageous effect of light extraction is achieved even when the transparent film 21 has a smaller thickness than the electrode 7.

Additionally, in this variation again, the light extraction efficiency can be further improved by forming a rough surface of asperities on the rear face of the translucent substrate as described above with reference to the first embodiment, or by providing a recess on the rear face of the translucent substrate as described above with reference to the second embodiment.

Figure 30:
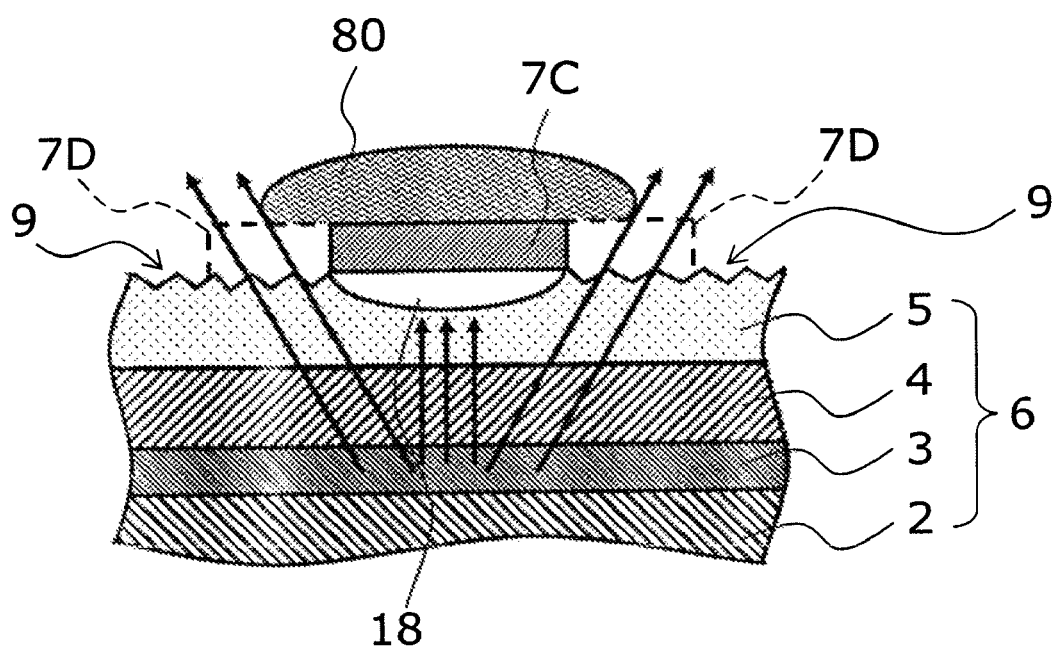
FIG. 30 is a schematic cross-sectional view showing a semiconductor light emitting device according to another variation of the embodiment of the invention.

FIG. 30 is a schematic cross-sectional view showing a semiconductor light emitting device according to another variation of this embodiment.

More specifically, in this variation, a rough surface 9 is formed on the surface of the semiconductor layer. Formation of the rough surface 9 serves to increase the light extraction efficiency by taking advantage of multiple reflections as described above with reference to FIG. 11. That is, the light emitted from the active layer 3 can be extracted with high efficiency whether the light is emitted below the fusion bonding portion 80 or in other light emitting regions.

Figure 31:
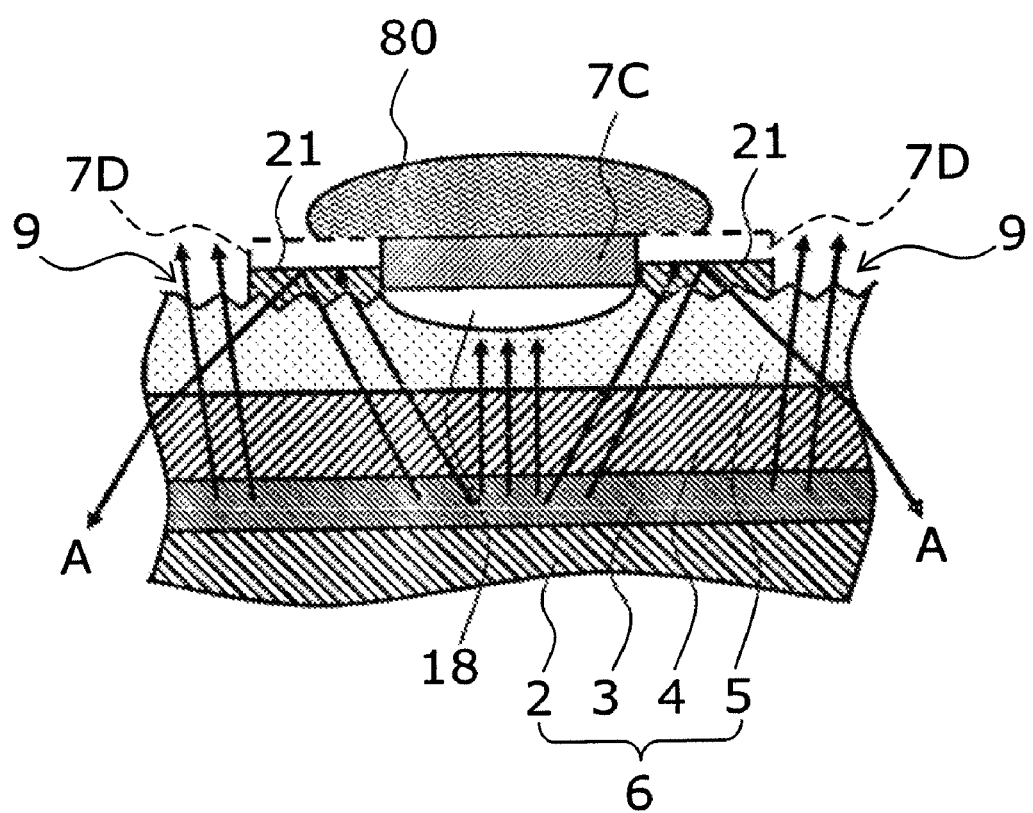
FIG. 31 is a schematic cross-sectional view showing a semiconductor light emitting device according to still another variation of the embodiment of the invention.

FIG. 31 is a schematic cross-sectional view showing a semiconductor light emitting device according to still another variation of this embodiment.

More specifically, this variation has a combined structure of the variations shown in FIGS. 29 and 30. The transparent film 21 and the rough surface 9 provided below the fusion bonding portion 80 facilitate reflecting and scattering effects, which allow the light emitted below the fusion bonding portion 80 to be extracted outside with higher efficiency.

Fifth Embodiment

Next, as a fifth embodiment of the invention, a semiconductor light emitting apparatus equipped with the semiconductor light emitting device of the embodiment of the invention will be described. More specifically, a semiconductor light emitting apparatus with high brightness can be obtained by packaging the semiconductor light emitting device described above with reference to the first to fourth embodiments on a lead frame, mounting board, or the like.

Figure 32:
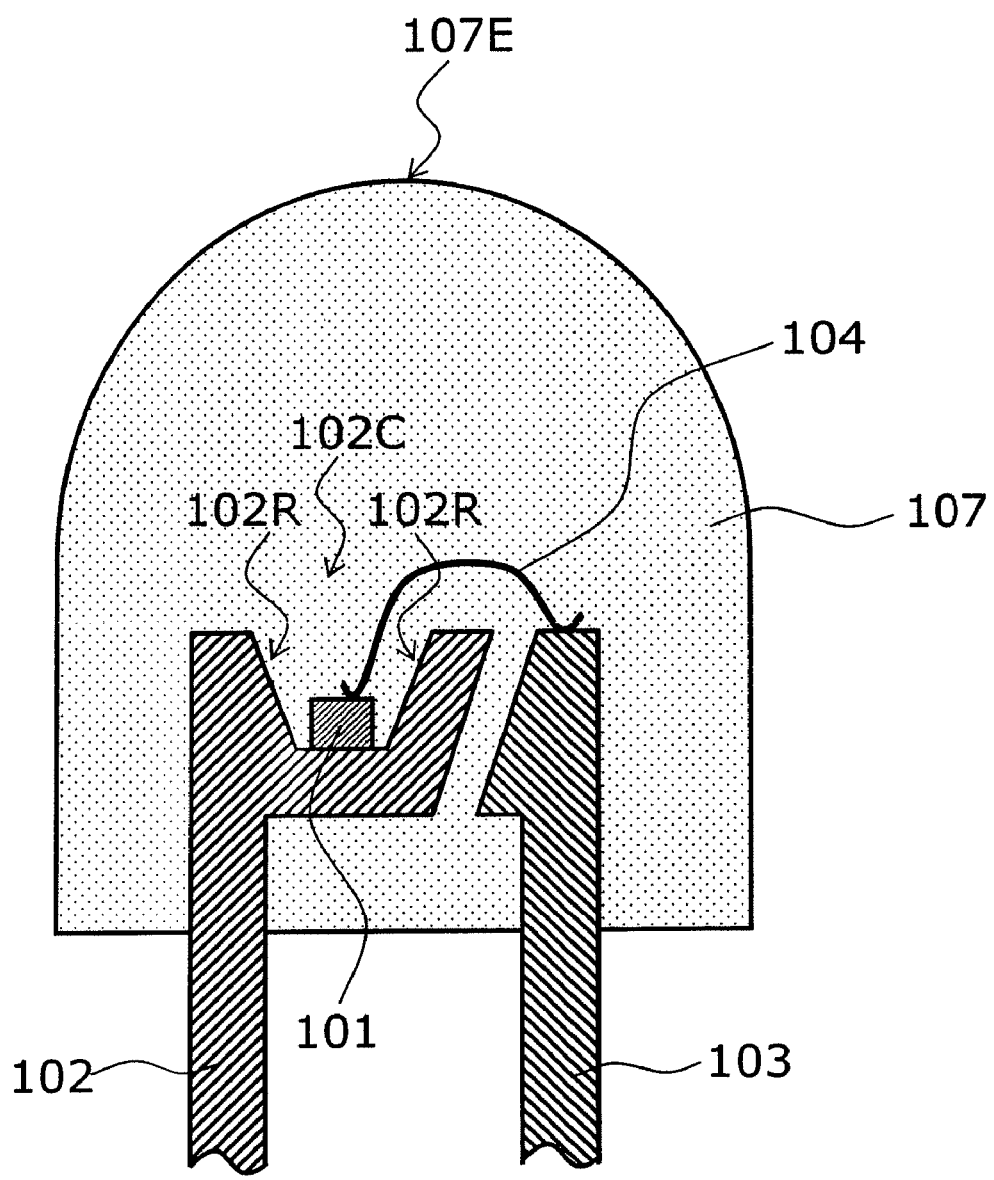
FIG. 32 is a schematic cross-sectional view showing a semiconductor light emitting apparatus of the embodiment of the invention.

FIG. 32 is a schematic cross-sectional view showing a semiconductor light emitting apparatus of this embodiment. The semiconductor light emitting apparatus of this example is a resin-sealed semiconductor light emitting apparatus called the "bullet-shaped" type.

A cup portion 102C is provided on top of a lead 102. The semiconductor light emitting device 101 is mounted on the bottom face of the cup portion 102C with an adhesive or the like. It is connected to another lead 103 using a wire 104. The inner wall of the cup portion 102C constitutes a light reflecting surface 102R, which reflects the light emitted from the semiconductor light emitting device 101 and allows the light to be extracted above. In this example, in particular, the light emitted from the side face and the like of the transparent substrate of the semiconductor light emitting device 101 can be reflected by the light reflecting surface 102R and extracted above.

The periphery of the cup portion 102C is sealed with translucent resin 107. The light extraction surface 107E of the resin 107 forms a condensing surface, which can condense the light emitted from the semiconductor light emitting device 101 as appropriate to achieve a predetermined light distribution.

Figure 33:
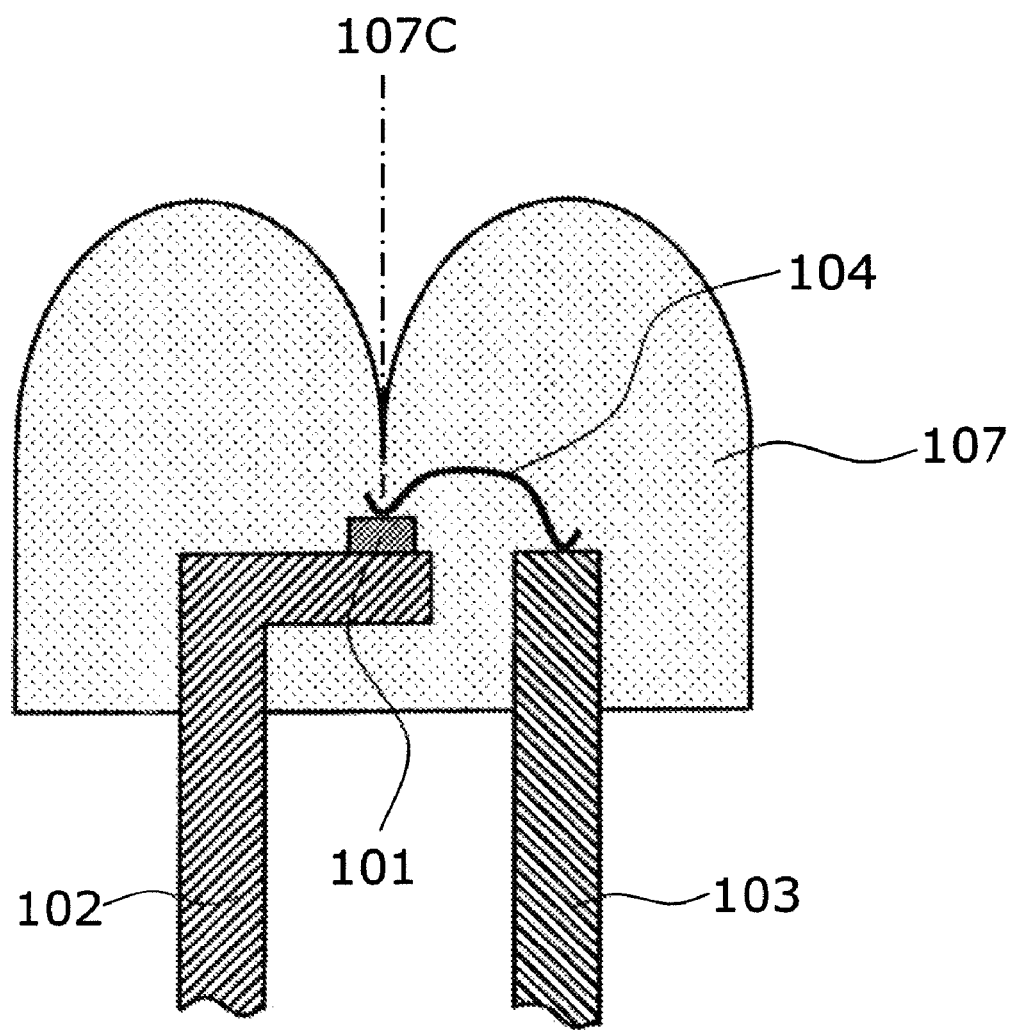
FIG. 33 is a schematic cross-sectional view showing another example of the semiconductor light emitting apparatus.

FIG. 33 is a schematic cross-sectional view showing another example of the semiconductor light emitting apparatus. More specifically, in this example, the resin 107 sealing the semiconductor light emitting device 101 has rotational symmetry about its optical axis 107C. It is shaped as set back and converged toward the semiconductor light emitting device 101 at the center. The resin 107 of such shape results in light distribution characteristics where light is scattered at wide angles.

Figure 34:
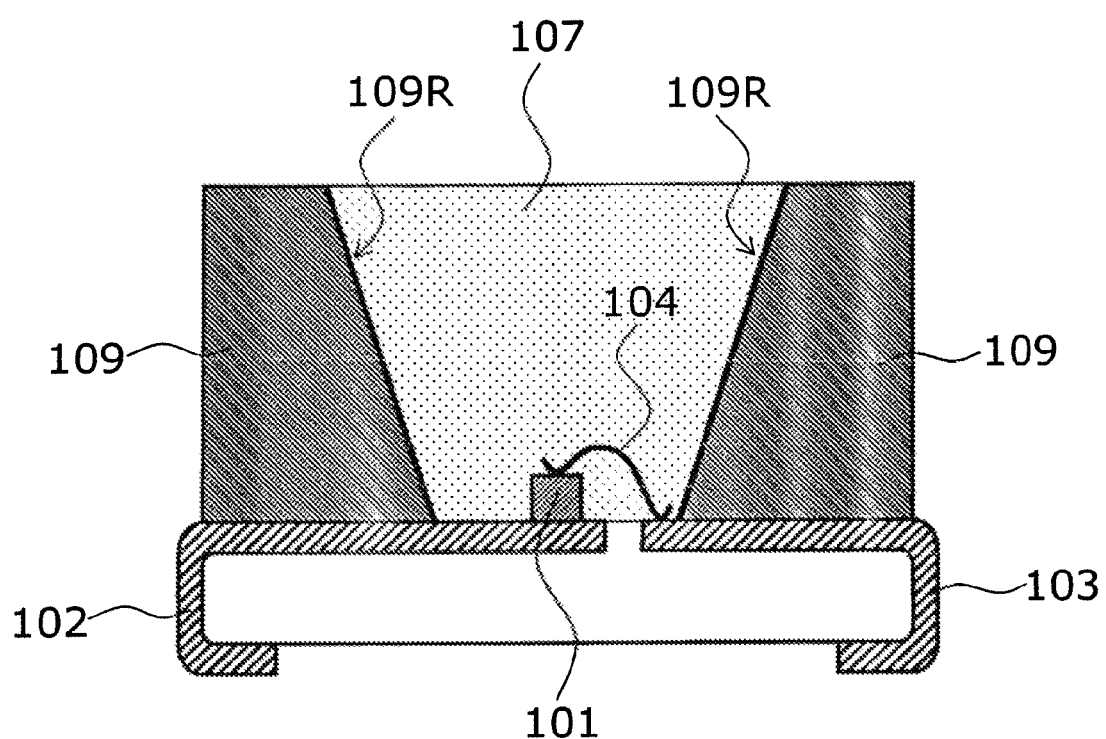
FIGS. 34 to 36 are schematic cross-sectional views showing still another example of the semiconductor light emitting apparatus.

FIG. 34 is a schematic cross-sectional view showing still another example of the semiconductor light emitting apparatus. More specifically, this example is called the "surface mounted" type. The semiconductor light emitting device 101 is mounted on a lead 102, and connected to another lead 103 using a wire 104. These leads 102 and 103 are molded in first resin 109. The semiconductor light emitting device 101 is sealed with second translucent resin 107. The first resin 109 has an enhanced light reflectivity by dispersing fine particles of titanium oxide, for example. Its inner wall 109R acts as a light reflecting surface to guide the light emitted from the semiconductor light emitting device 101 to the outside. That is, the light emitted from the side face and the like of the semiconductor light emitting device 101 can be extracted above.

Figure 35:
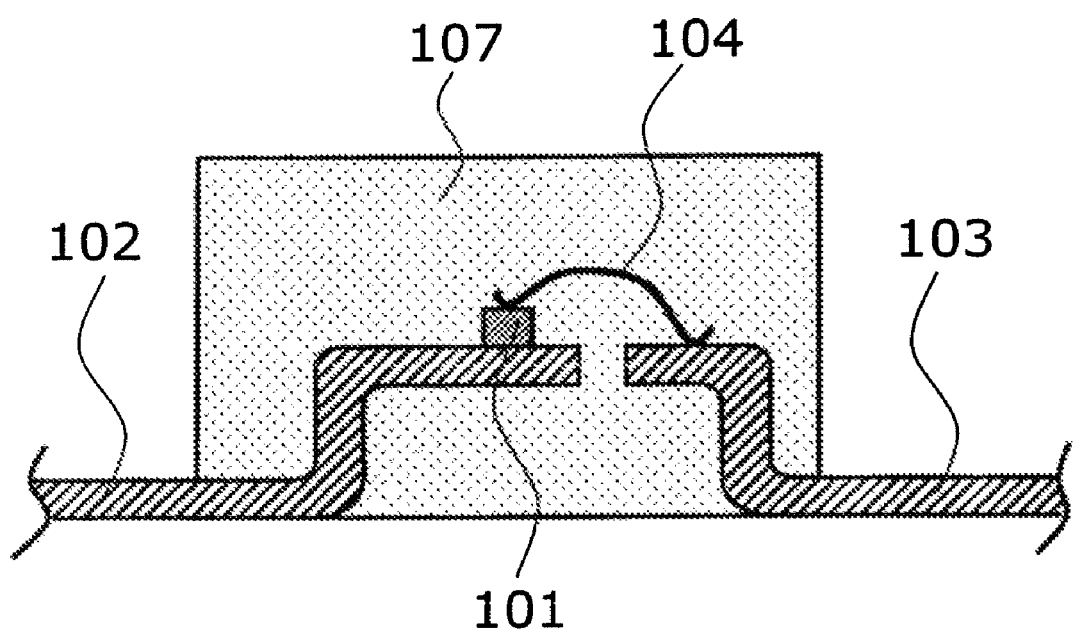

FIG. 35 is a schematic cross-sectional view showing still another example of the semiconductor light emitting apparatus. More specifically, this example is also what is called the "surface mounted" type. The semiconductor light emitting device 101 is mounted on a lead 102, and connected to another lead 103 using a wire 104. The tips of these leads 102 and 103, together with the semiconductor light emitting device 101, are molded in translucent resin 107.

Figure 36:
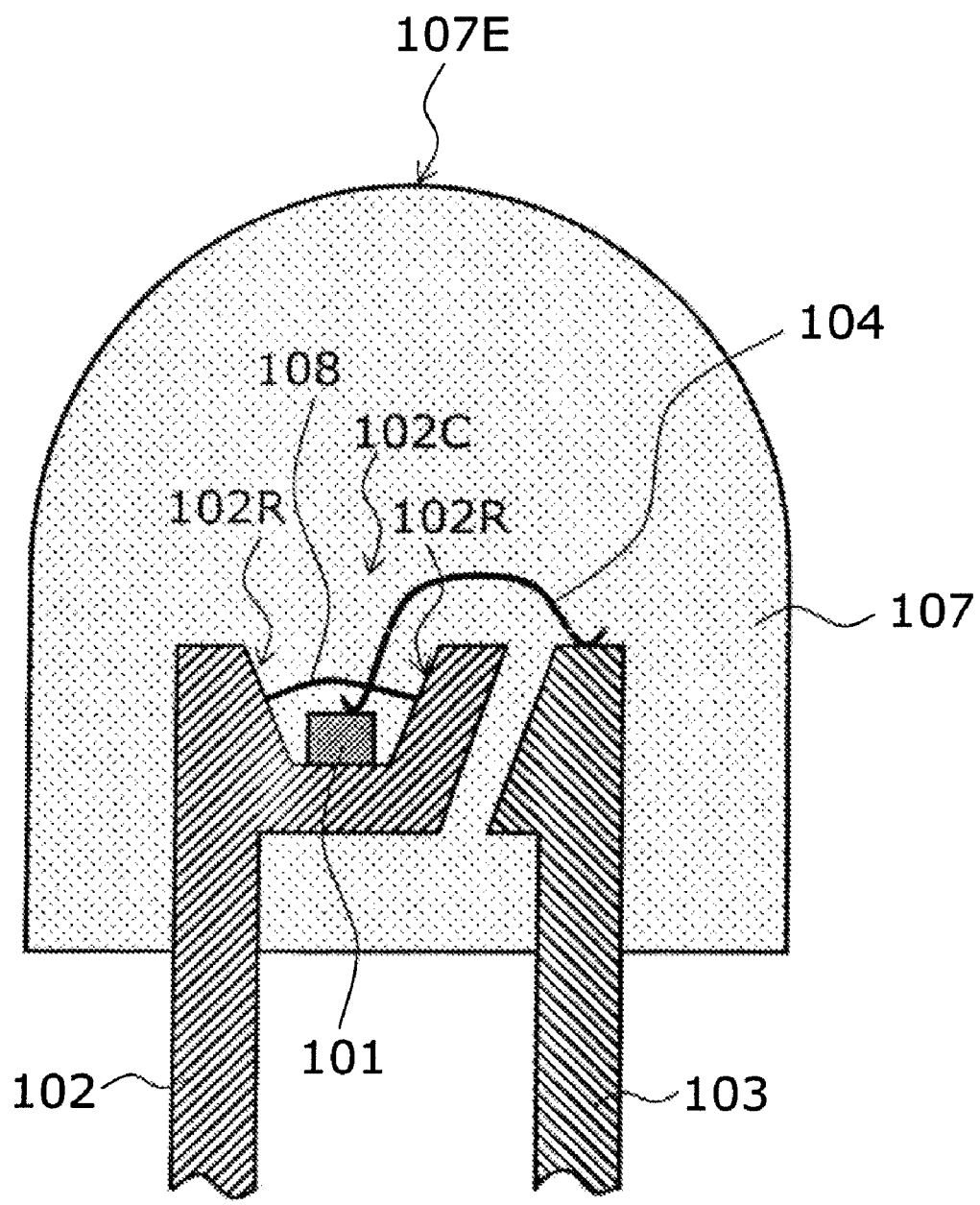

FIG. 36 is a schematic cross-sectional view showing still another example of the semiconductor light emitting apparatus. In this example, a structure similar to that described above with reference to FIG. 32 is used. In addition, the semiconductor light emitting device 101 is covered with phosphor 108. The phosphor 108 serves to absorb the light emitted from the semiconductor light emitting device 101 and convert its wavelength. For example, ultraviolet or blue primary light is emitted from the semiconductor light emitting device 101. The phosphor 108 absorbs this primary light and emits secondary light having different wavelengths such as red and green. For example, three kinds of phosphor may be mixed, and the phosphor 108 may absorb ultraviolet radiation emitted from the semiconductor light emitting device 101 to emit white light composed of blue, green, and red light.

The phosphor 108 may be applied to the surface of the semiconductor light emitting device 101, or may be contained in the resin 107.

In any semiconductor light emitting apparatus shown in FIGS. 32 to 36, a semiconductor light emitting apparatus with high brightness can be offered by providing the semiconductor light emitting device described above with reference to the first to fourth embodiments to extract light from the top and/or side faces of the semiconductor light emitting device 101 with high efficiency.

Embodiments of the invention have been described with reference to specific examples. However, the invention is not limited to the specific examples. For example, various variations of the semiconductor light emitting device and the semiconductor light emitting apparatus with respect to their structure and the like are also encompassed within the scope of the invention.

For example, any details of the layered structure constituting the semiconductor light emitting device modified as appropriate by those skilled in the art are also encompassed within the scope of the invention, as long as they comprise the feature of the invention. For instance, the active layer may be made of various materials in addition to InGaAlP-based material, including $Ga_xIn_{1-x}As_yN_{1-y}$-based ($0 \leq x \leq 1$, $0 \leq y < 1$), AlGaAs-based, and InGaAsP-based materials. Similarly, the cladding layers and optical guide layer may also be made of various materials.

In addition, the wafer bonding described as a typical example of the method of manufacturing a LED having a light-transmitting substrate may also be applied to conventionally known LEDs such as AlGaAs-based LEDs in which the transparent substrate is obtained by thick epitaxial growth.

Any shape and size of the semiconductor light emitting device modified as appropriate by those skilled in the art are also encompassed within the scope of the invention, as long as they comprise the feature of the invention.

Furthermore, a semiconductor light emitting device and a semiconductor light emitting apparatus obtained from any combination of two or more of the embodiments of the invention are also encompassed within the scope of the invention. More specifically, for example, a semiconductor light emitting device and a semiconductor light emitting apparatus obtained by combining the first embodiment of the invention with any of the second to fourth embodiments of the invention are also encompassed within the scope of the invention. The third and the fourth embodiments may also be combined. Any other combinations that are technically feasible are also encompassed within the scope of the invention.

Any other semiconductor light emitting devices and semiconductor light emitting apparatuses that can be modified and implemented as appropriate by those skilled in the art on the basis of the semiconductor light emitting devices and semiconductor light emitting apparatuses described above as the embodiments of the invention also belong to the scope of the invention.

The invention claimed is:

1. A semiconductor light emitting device comprising:
    a substrate having a top face and a rear face electrode forming portion opposed thereto, the substrate being translucent to light in a first wavelength band, the rear face electrode forming portion being surrounded by a rough surface;
    a semiconductor stacked structure provided on the top face of the substrate and including an active layer that emits light in the first wavelength band;
    a first electrode provided on the semiconductor stacked structure;
    a second electrode provided on the rear face electrode forming portion;
    a reflective film coated on at least a portion of the rough surface; and
    an adhesive with which the semiconductor light emitting device is mounted,
    wherein
    the rear face electrode forming portion has a smaller area than the top face,
    the substrate has a first side face extending generally vertically from the top face and a second side face that obliquely extends from the first side face to the rear face electrode forming portion,
    the rough surface is formed on the first and second side faces,
    the adhesive climbs up on the second side face, and
    the reflective film is provided on the second side face to exist after the rough surface is formed, and between the substrate and the adhesive.

2. The semiconductor light emitting device according to claim 1, wherein the rough surface is formed by etching with hydrofluoric acid.

3. The semiconductor light emitting device according to claim 1, wherein the rough surface is composed of a collection of pyramids.

4. The semiconductor light emitting device according to claim 1, wherein the reflective film is made of gold.

5. The semiconductor light emitting device according to claim 1, wherein the substrate is made of GaP.

6. The semiconductor light emitting device according to claim 1, wherein the active layer is made of InGaAlP.

7. The semiconductor light emitting device according to claim 1, wherein the rough surface is formed by etching with concentrated hydrofluoric acid.

8. The semiconductor light emitting device according to claim 1, wherein the adhesive is one of silver paste or solder.

9. The semiconductor light emitting device according to claim 1, wherein the reflective film is provided only on the second side face.

* * * * *